United States Patent [19]

Nakamura et al.

[11] Patent Number: 5,684,810
[45] Date of Patent: Nov. 4, 1997

[54] ERROR CORRECTING DECODER AND ERROR CORRECTION DECODING METHOD

[75] Inventors: Takahiko Nakamura; Hideo Yoshida, both of Kanagawa, Japan

[73] Assignee: Mitsubishi Denki Kabushiki Kaisha, Tokyo, Japan

[21] Appl. No.: 350,892

[22] Filed: Dec. 7, 1994

[30] Foreign Application Priority Data

Dec. 28, 1993 [JP] Japan ..................... 5-337751

[51] Int. Cl.$^6$ ..................... G11B 20/18
[52] U.S. Cl. ........... 371/37.4; 371/38.1; 371/40.3
[58] Field of Search ................ 371/37.4, 37.5, 371/38.1, 40.3

[56] References Cited

U.S. PATENT DOCUMENTS

| | | | |
|---|---|---|---|
| 4,646,301 | 2/1987 | Okamoto et al. | 371/37.4 |
| 4,653,051 | 3/1987 | Sugimura et al. | 371/37.4 |
| 4,682,333 | 7/1987 | Onishi et al. | 371/37.4 |
| 4,937,829 | 6/1990 | Kadokawa | 371/37.6 |
| 4,972,416 | 11/1990 | Nagai et al. | 371/37.4 |
| 5,247,523 | 9/1993 | Arai et al. | 371/37.4 |

FOREIGN PATENT DOCUMENTS

| | | |
|---|---|---|
| 329789 | 8/1989 | European Pat. Off. |
| 426657 | 5/1991 | European Pat. Off. |
| 3422461 | 1/1985 | Germany. |
| 57-10559 | 1/1982 | Japan. |
| 58-29237 | 2/1983 | Japan. |

*Primary Examiner*—Stephen M. Baker
*Attorney, Agent, or Firm*—Wolf, Greenfield & Sacks, P.C.

[57] ABSTRACT

After one dimension of error detection and correction has been performed on a block of data, error correction in the other dimension may be selected to be either erasure-and-error correction or simply error correction. The selection is of erasure-and-error correction, which uses results of the error correction in the first dimension, when an indication of a burst error has been detected during the row error correction, or when the number of maximum error corrections within the row error correction is small enough, or when uncorrectable errors within the row error correction is small enough. Otherwise, error correction is selected.

41 Claims, 22 Drawing Sheets

3. S/W ON GENERAL-PURPOSE H/W

FIG. 7
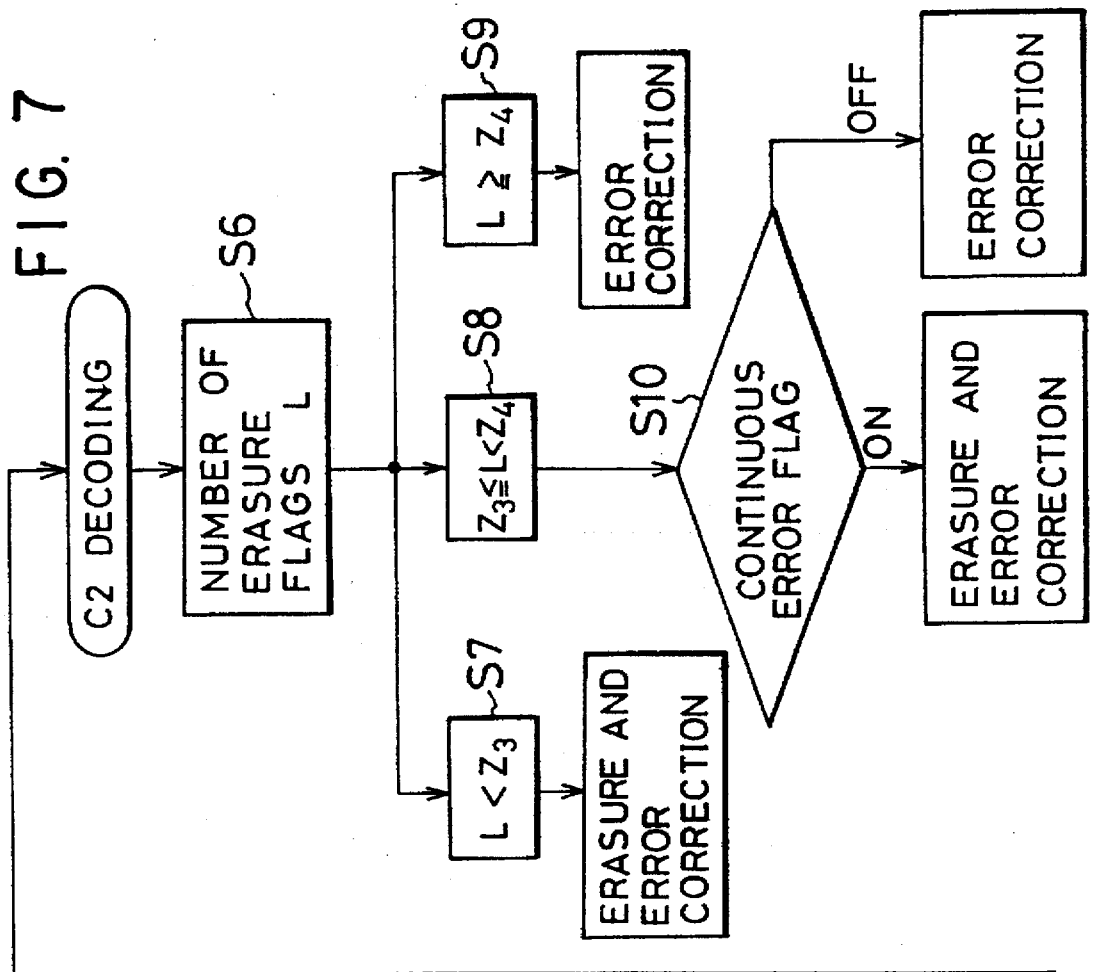
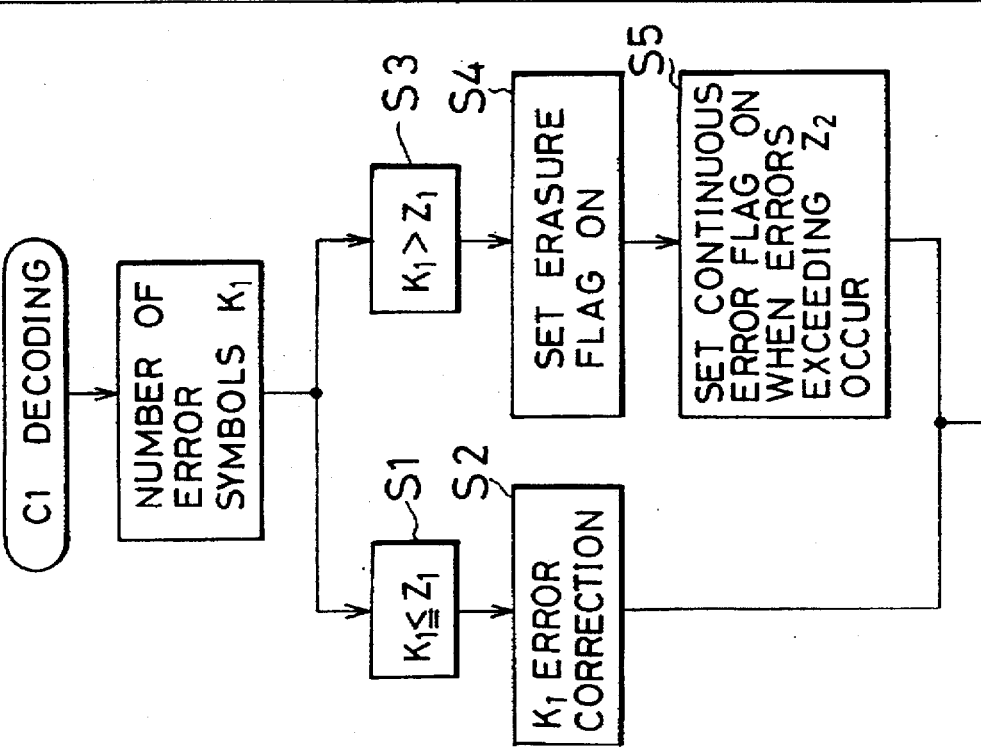

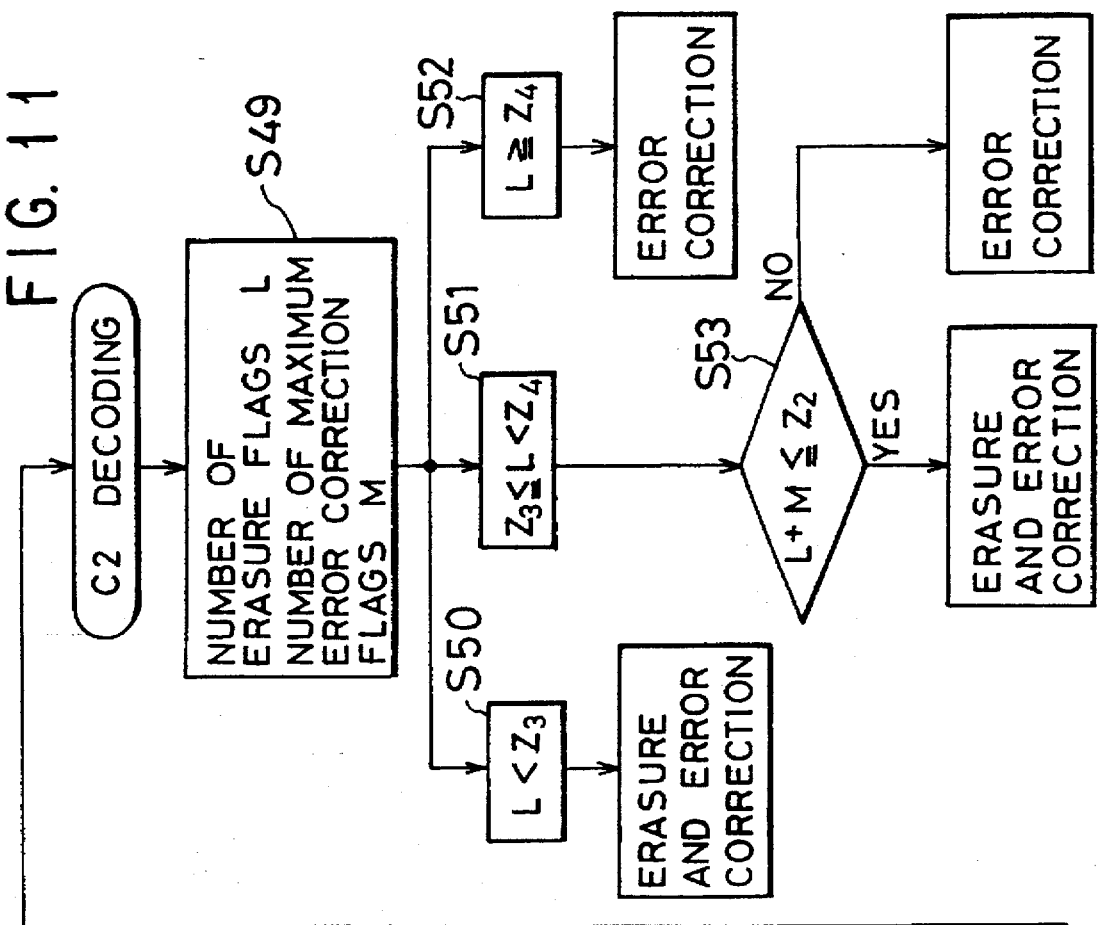
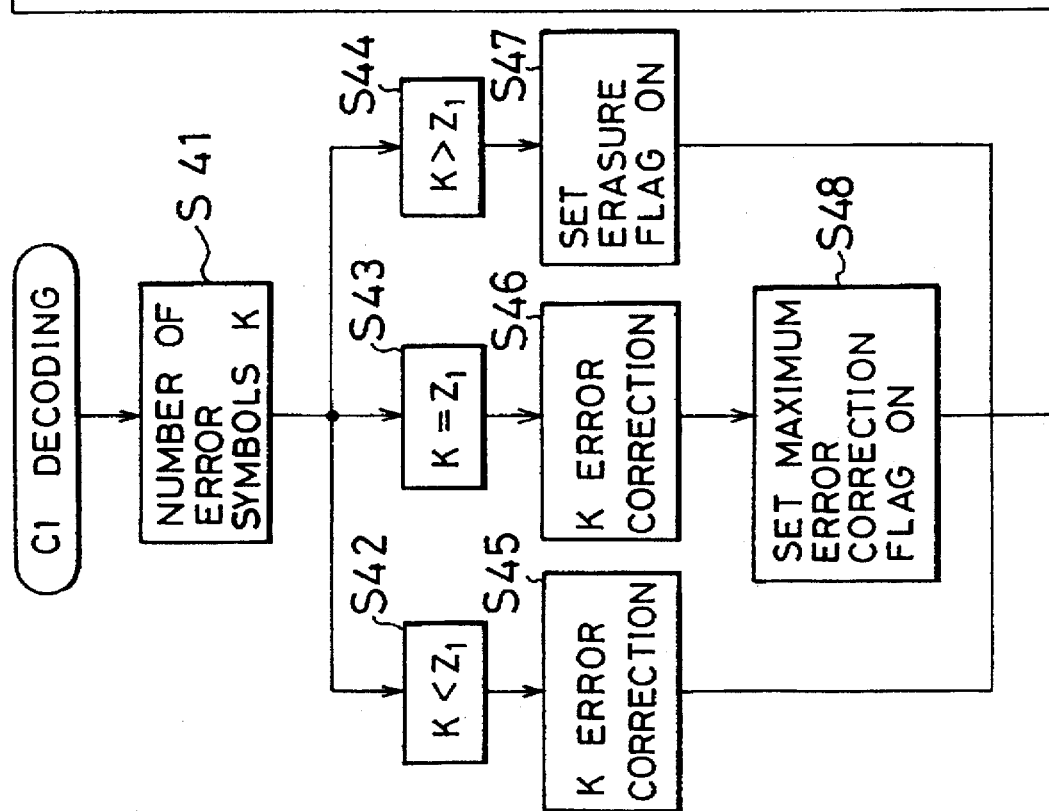
FIG. 11

$Z_1$ = PREDETERMINED VALUE

FIG. 22
BLOCK STRUCTURE OF PRODUCT CODE

ERROR CORRECTING DECODER AND ERROR CORRECTION DECODING METHOD

BACKGROUND OF THE INVENTION

This invention relates to a method and apparatus for correcting errors in uncorrected encoded data in a storage device, and more particularly, to an error-correction decoding method and an error-correcting decoder to be used in audio and visual digital signal processing.

DESCRIPTION OF THE PRIOR ART

The error-correction decoding method using a product code for a digital audio tape was carried in an article issued Jun. 29th, 1987, by the Nikkei Electronics, one of Japan's leading biweeklies. The flowchart shown in FIG. 21 embodies the theory of this conventional error-correction decoding method and FIG. 22 illustrates a block structure of a product code, where, (32, 28, and 5) Reed-Solomon (RS) codes are employed as the C1 code for each single row and (32, 26, and 7) RS codes are employed as the C2 code for each single column.

Based on a syndrome obtained for the received word data, the number of errors of a received word in C1 code is estimated. When the number of errors is estimated to be one, single-error correction is performed for the error. When the number of errors is estimated to be two, double-error correction is performed, and two erasure flags are set on in a memory so as to indicate the locations of the two errors. If the number of errors is estimated to be three or more, instead of performing error correction, erasure flags indicating the locations of uncorrectable errors of the received word are set on in the memory.

When the abovementioned operation is repeated 32 times in the direction of row, a C1 code signal will have been decoded.

Upon completion of decoding a C1 code signal, a number of errors of the received words is calculated, during C2 coding based on the decoded C1 data.

When the number of errors is determined to be one, single-error correction is performed for the error. When the number of errors is determined to be two, double-error correction is carried out. When three errors are determined to have occurred, a method of correcting errors depends on the number of erasure flags set on during C1 decoding: when two erasure flags have been set on, double-erasure and single-error correction is performed and triple-erasure correction is performed when there are three erasure flags. Likewise, if the number of errors is determined to be four, triple-erasure and single-error correction is performed when there are three erasure flags and quadruple-erasure correction is performed when there are four erasure flags. If it is determined that there are five errors in C2 code, quintuple-erasure correction is performed. In the event of six errors are estimated, sextuple-erasure correction is carried out when there are six erasure flags.

If the number of erasure flags is greater than six, error detection is performed instead of error correction for C2 decoding.

C2 decoding will be completed when the abovementioned operation is repeated 28 times for the information section, or 32 times for all codes in the block of a product code in the direction of columns illustrated in FIG. 22.

Problems to be Solved by This Invention

In the prior art techniques, there is such a notable disadvantage that errors are detected but remain uncorrected if, for instance, a lengthy burst error combined with two random errors for which double-error correction is performed occurs in C1 code. This is because the number of erasure flags increases in proportion to the number of errors, and erasure flags exceeding the decoding capacity of C2 code would result only in error detection.

Moreover, there is always a possibility of correcting received words erroneously. Erroneously corrected received words plus a large number of erasure flags of random errors would inevitably end up in many erroneously decoded symbols of the C2 code.

Accordingly, it is a primary object of the present invention to realize a decoder and a decoding method that can correct errors even when both a lengthy burst error and random errors have occurred simultaneously.

Another object of present invention is to achieve a decoder and a decoding method that can minimize the erroneous erasure correction in C2 decoding.

SUMMARY OF THE INVENTION

The purpose of the present invention is to achieve an error-correcting decoder that ensures an efficient and time-saving error-correction decoding method that can minimize error occurrence, and may also perform an optimum decoding according to the type of detected errors, e.g., a burst or random errors, or perhaps, both combined.

This purpose is achieved by an error-correcting decoder for decoding a code signal composed of n2 rows×n1 columns of symbols including error-correction codes for one of error-correction or erasure-and-error correction, and for correcting errors of a received word in the code signal based on the error-correction codes, the decoder having the following components:

a first decoder that corrects correctable errors of each row and detects uncorrectable errors, a flag memory that sets a burst error flag on if the number of detected continuous uncorrectable-errors of the each row exceeds a first predetermined value, a location memory that stores locations of rows having an uncorrectable-errors detected by the first decoder, a counter that counts the number of rows having uncorrectable-errors detected by the first decoder, and a second decoder that corrects errors of each column. It decodes the received word based on erasure-and-error correction using the locations in the location memory when the number in the counter is between second and third predetermined values and the burst-error flag is on. It decodes the received word based on error-correction when the number in the counter is between the second and third predetermined values and the burst-error flag is off.

The purpose is also achieved by an error-correcting decoder which decodes a code signal composed of n2 rows×n1 columns of symbols including error-correction codes for one of error-correction and erasure-and-errors correction. The decoder corrects error of a received words in the code signal based on the error-correction codes. The decoder is comprised of the following components:

a first decoder that corrects correctable errors of each row and detects uncorrectable errors, a location memory that stores locations of rows having uncorrectable errors detected by the first decoder, a first counter that counts the number of rows having uncorrectable errors detected by the first decoder, a second counter that counts the number of maximum-error-correction flags, a maximum error-correction flag being set in each row if a number of detected error of the symbols in the row is equal to the maximum-correctable-error value, and a second decoder that corrects an error of each column as the received word n1 times, and decodes the received word based on erasure-and-error correction using the locations in the location memory when the number in the first counter is between a second and a third predetermined values and the sum of the number in the first counter plus the number in the second counter is less than a first predetermined value. It decodes the received word based on error-correction when the number in the first counter is between the second and third predetermined values, and the sum of the number in the first counter plus the number of the second counter is more than the first predetermined value.

The purpose is also achieved by an error-correcting decoder that decodes a code signal composed of n2 rows×n1 columns of symbols including error-correction codes for one of error-correction and erasure-and-error correction, and corrects error of the code signal based on the error-correction codes, the decoder having the following components:

a first decoder that corrects an error of each row and detects an uncorrectable error of the row, a location memory that stores locations of rows having an uncorrectable error detected by the first decoder, a counter that counts a number of rows having an uncorrectable error detected by the first decoder, a Chien-Search circuit that calculates error locations and error magnitudes of Euclid algorithm. It sets a number of the error-locations, wherein the number of uncorrectable-error rows is initially zero, a second decoder that corrects an error of each column, and it decodes the received word based on the erasure-and-error correction using the locations in the location memory in case that the number in the counter is less than a first predetermined value, and that the number of the error-locations in the Chien-Search circuit at the first time is more than a second predetermined value, and decodes the received word based on the error-correction when the number in the counter is more than the first predetermined value, and the number of the error-locations at the first time in the Chien-Search circuit is more than the second predetermined value.

The purpose is achieved by a decoding method for decoding a code signal composed of n2 rows×n1 columns of symbols including error-correction codes, and for correcting error of the code signal having the following steps:

generating location polynomials based on syndromes of the received word, analyzing error-locations and error-magnitudes of the each row based on the location polynomials, correcting each row using the error-correction codes if an error has occurred and a number of the error-locations is less than a first predetermined value in the row, memorizing an element of the row in a Galois field as an uncorrectable error element if the number of the error-locations is more than the first predetermined value in each row, setting a burst-error flag on if the number of detected consecutive uncorrectable-error of the row exceeds a second predetermined value, analyzing error-locations and error-magnitudes of each column based on the location polynomials, correcting each column based on erasure-and-error correction if an error has occurred in each column, the number of the uncorrectable-error elements is less than a third predetermined value, and the burst-error flag is set on, and correcting each column based on error-correction if an error has occurred in each column, the number of the uncorrectable-error elements is less than a third predetermined value, and the burst-error flag is off.

The purpose is also achieved by a decoding method for decoding a code signal composed of n2 rows×n1 columns of symbols including error-correction codes, and for correcting error of the code signal, the method having the following steps:

a generating location polynomials based on syndromes of the code signal, analyzing error-locations and error-magnitudes of each row based on the location polynomials, correcting each row based on the error-correction if an error has occurred, and the number of the error-locations in each row is less than a first predetermined value, memorizing an element of the row in a Galois field as an uncorrectable-error element if the number of the error-locations is more than the first predetermined value in each row, setting a maximum-error-correction flag on if the number of detected errors of the symbols in a row is equal to maximum-correctable-error value, analyzing error-locations and error-magnitudes of the column based on the location polynomials, correcting each column based on erasure-and-error correction if an error is occurred, the number of the uncorrectable-error elements is less than a second predetermined value, and the number of the maximum-error correction flag is less than a third predetermined value, and correcting the received word in each column based on error-correction if an error is occurred, and the number of the uncorrectable-error elements is less than the second predetermined value, and the number of the maximum-error-correction flag is more than the third predetermined value.

The purpose is effectively achieved by adding the steps of filling received word in the uncorrectable-error elements of the rows using the correcting step in column, and of correcting the received words again based on the filling step to the decoding method.

BRIEF DESCRIPTION OF THE DRAWINGS

FIG. 7 illustrates an operational flow of an error correcting decoder according Embodiment 1 of the present invention.

FIG. 11 shows an operation flow of error correcting decoder according to Embodiment 3 of the present invention.

FIG. 22 shows the structure of product codes.

DETAILED DESCRIPTION

Embodiment 0

Figure 1:
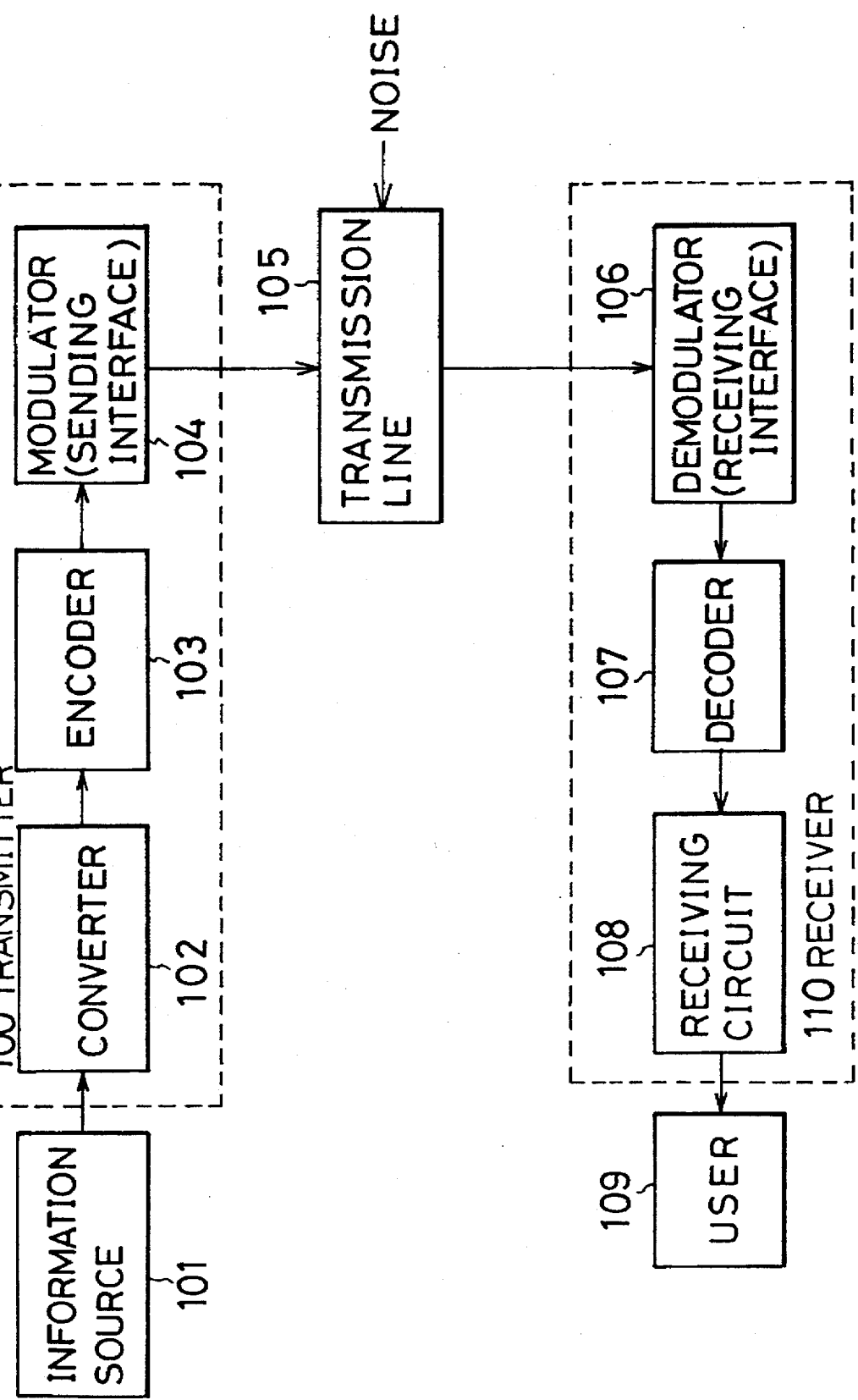
FIG. 1 depicts a general communications system configuration.

FIG. 1 is a general description of a system configuration equipped with a decoder in accordance with the present invention. A communications system outlined in the Figure is made up of two major parts: a transmitter 100 and a receiver 110, which are connected with a transmission line 105. A converter 102 receives the information sent from a source 101 and converts it into electronic signal. The signal is then transmitted to an encoder 103 and travels to a modulator 104. The sending information, now being coded and modulated, is output to the transmission line 105. The code signal, whether it is transmitted by wire or wireless, is constantly susceptible to outside noise. Thus the code signal reached to a receiver 110 is affected by outside noise and must first be restored to its original waveform at a demodulator (receiving interface) 108. Then it is sent to and decoded by a decoder (error-correcting decoder) 107. The waveform is converted to the receiving signal at a receiving circuit 108 before reaching a user 109.

Figure 2:
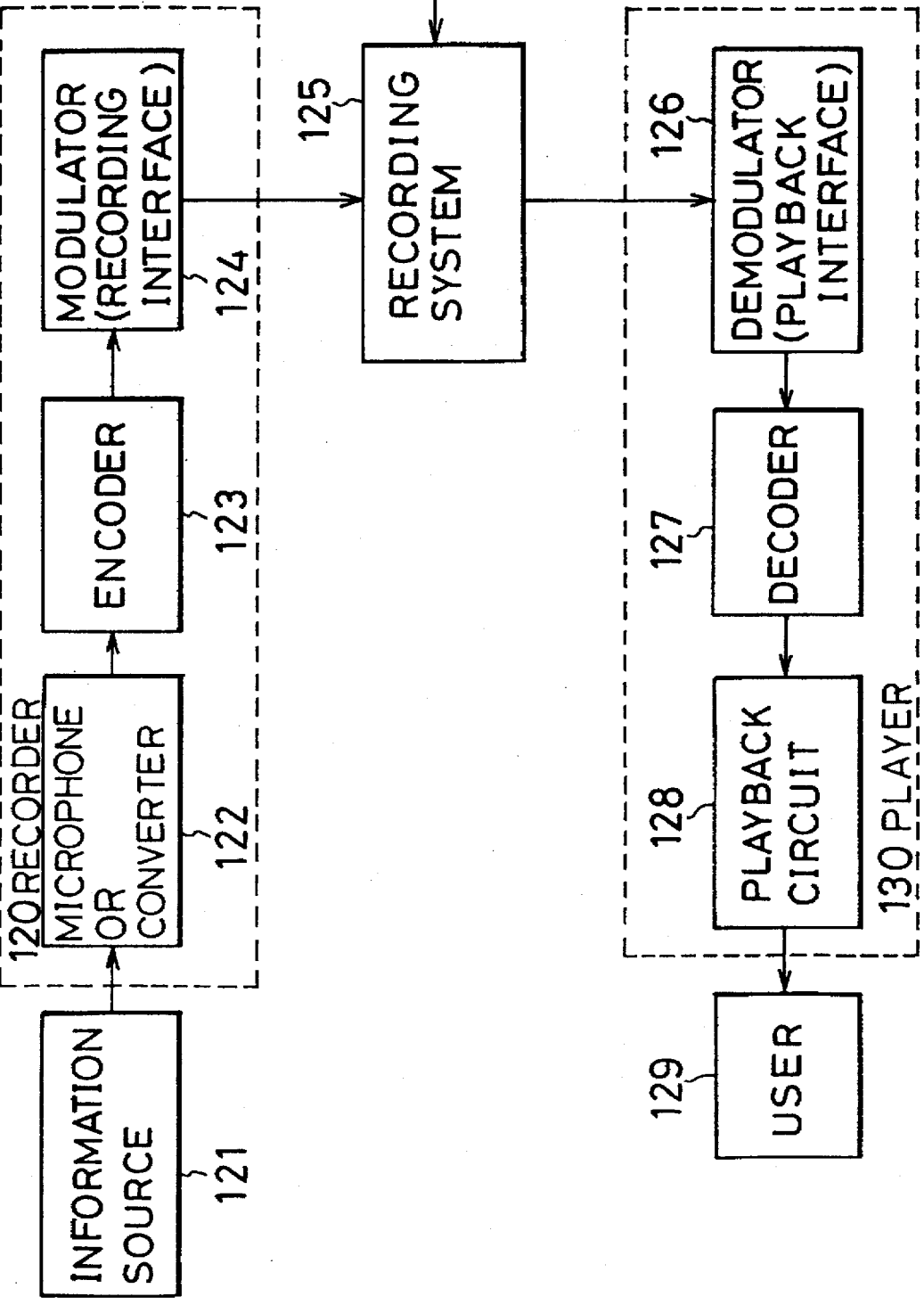
FIG. 2 shows a general description of a recording system configuration.

FIG. 2 outlines a system configuration for a recording system which is largely made up of a recorder 120 and a player 130. An input information source 121 is converted into an electronic signal through a microphone or converter 122. The signal is then encoded by an encoder 123, modulated by a modulator 124, and then recorded on a recording system 125, for instance a tape. The recording system is susceptible to outside noise during recording and playback. Signals are fetched from a tape by a player 130. The recorded signal is demodulated by a demodulator (playback interface) 126, decoded by a decoder (error-correcting decoder) 127, then restored to the original electronic signal before reaching a user 129 as sound from a speaker via a playback circuit 128.

Figure 3:
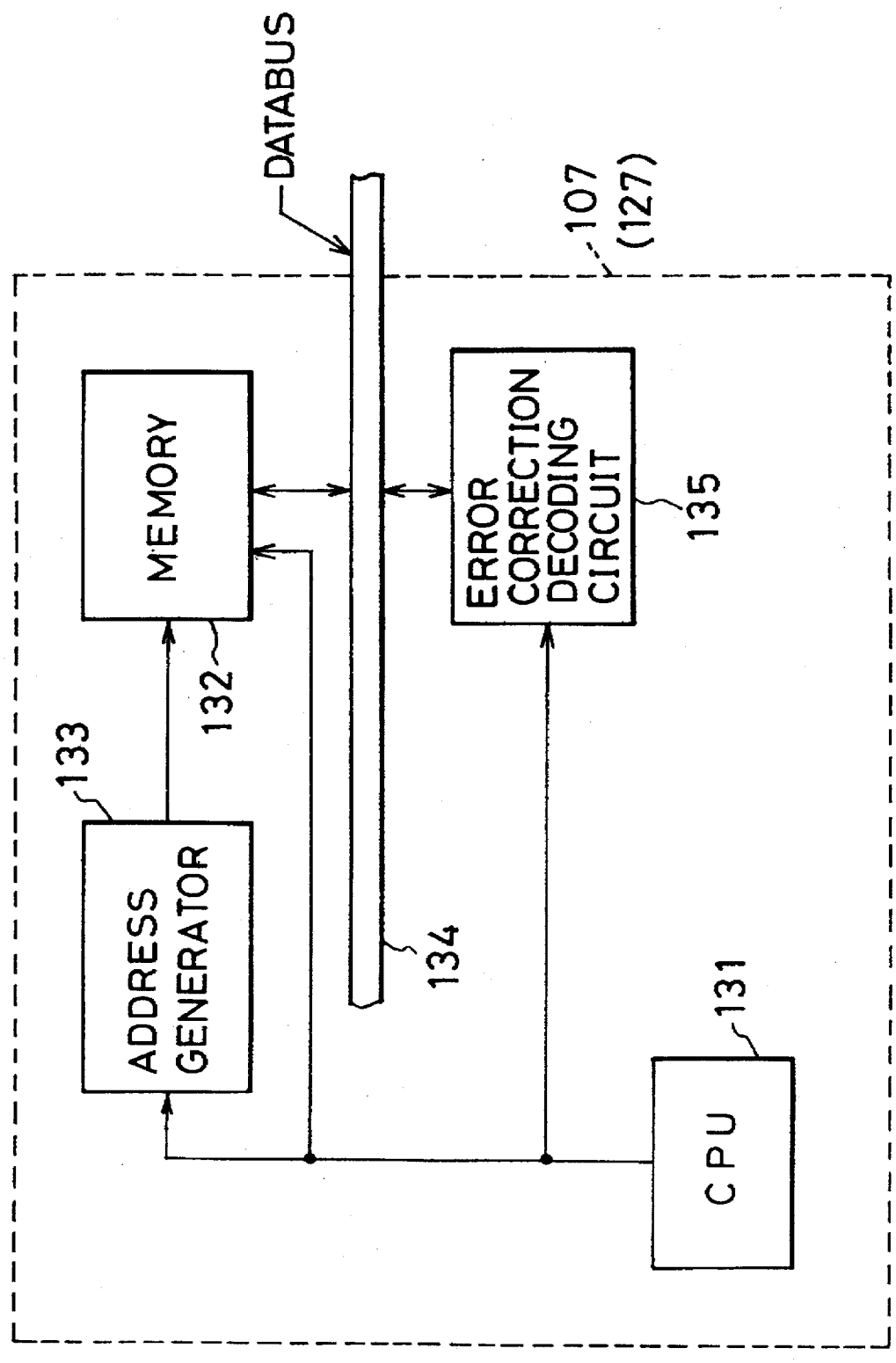
FIG. 3 shows a special-purpose H/W configuration.

The decoders 107 and 127 shown in FIGS. 1 and 2 are configured specially by hardware or by software. In FIG. 3, which shows hardware configuration, a sequence of receiving words is once stored to a memory 132 from a demodulator 106 or 126 via a databus 134 by CPU 131. The input sequence of received words is then decoded by eliminating generated noise through an error correction decoding circuit 135 according to the instruction from an address generation circuit 133.

With respect to a software configuration for a general-purpose processor, a decoder is configured by a CPU 141 and a memory 142 which contains the software. An input information is sent via a databus 143, and the decoded result is temporarily stored in a memory 142 before being output to the databus 143. The CPU 141 performs the software which achieves the decoding.

Figure 5:
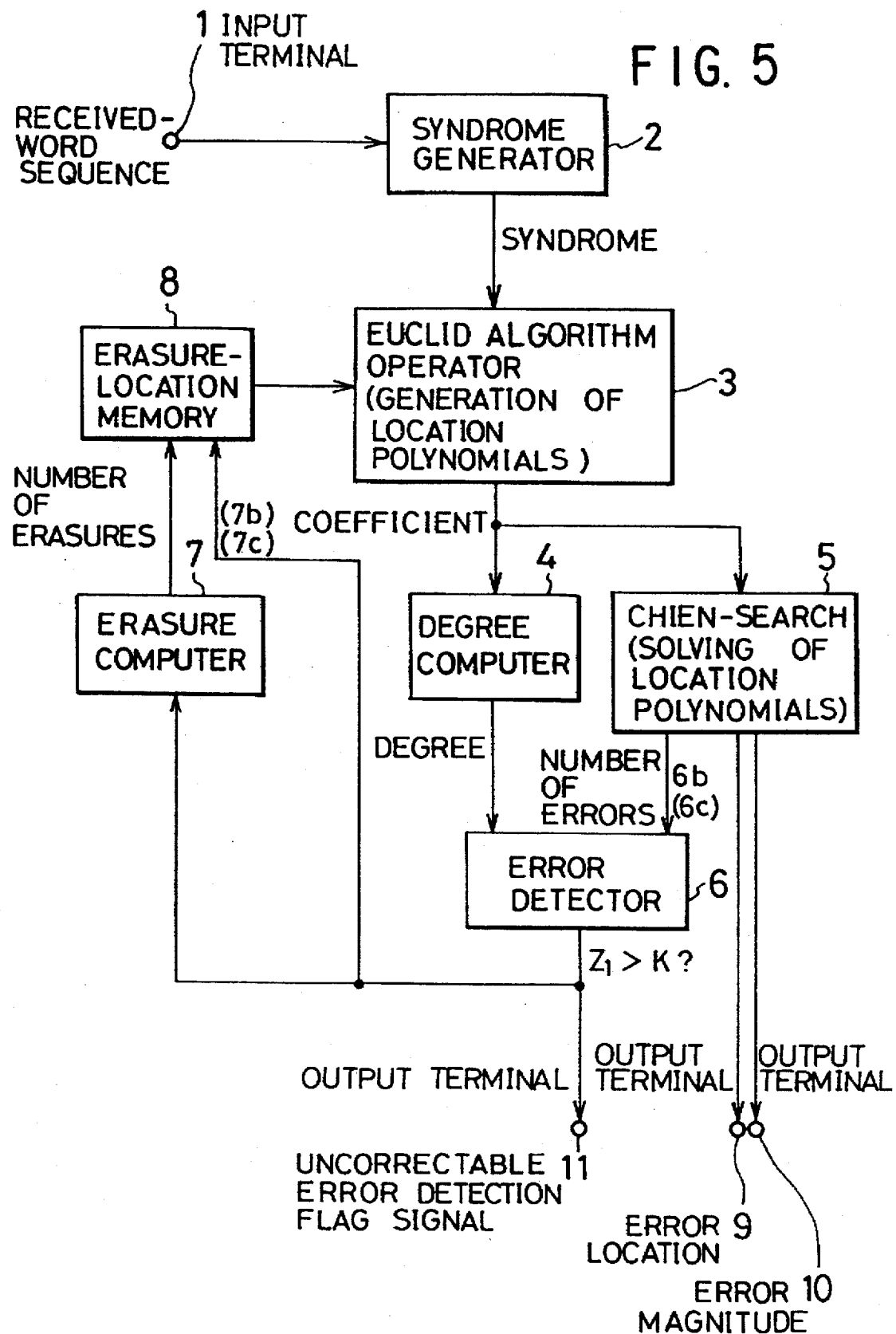
FIG. 5 depicts a configuration of error correcting decoder in accordance with the present invention.

FIG. 5 gives details of an error correction decoding circuit 135 for a special hardware configuration.

Embodiment 1

In a block of data having error correcting codes in directions of both rows and columns, uncorrectable errors of a received word in rows found continuously more than a predetermined value is highly indicative of the occurrence of burst errors. In such a case, erasure-and-error correction must be performed for C2 column decoding. On the contrary, when burst errors are not likely to have occurred, errors might be erroneously corrected if decoding is implemented based on erasures when many erasure flags have been set on. Therefore, in this case, erasures are ignored to enable an efficient error correction. While the explanations in this specification are given with respect to rows and columns, those skilled in the art will realize that the concepts are just as valid for columns and rows, or any other dimension such as time.

An example of error correcting decoder based on this theory is elaborated below using FIG. 5, where; an input terminal 1 receives a sequence of received words, a syndrome generator 2 calculates a syndrome based on the received words, a Euclid algorithm operator 3 calculates error-location polynomial and error-magnitude polynomial based on the syndromes and the erasure locations, a degree calculator 4 calculates a degree of an error-location polynomial, a Chien-Search 5 calculates an error location, error magnitude, and the number of errors based on the error-location polynomials and error-magnitude polynomials. An error detector 6 outputs signals of uncorrectable-error flags to implement error detection instead of error correction based on the degree of the error-location polynomials and the number of errors calculated by the Chien-Search if errors in the received word is more than the predetermined value. An erasure computer 7 outputs the number of erasures for C2 decoding based on the output signal for uncorrectable-error flags in C1 decoding. The erasure locations for the received words that output the signal of uncorrectable-error flags during C1 decoding are stored in an erasure-location memory 8. Error locations are output from an output terminal 9 and an error magnitudes are output from an output terminal 10, whereas signals of uncorrectable-error flags indicating uncorrectable errors are output through an output terminal 11.

Figure 6:
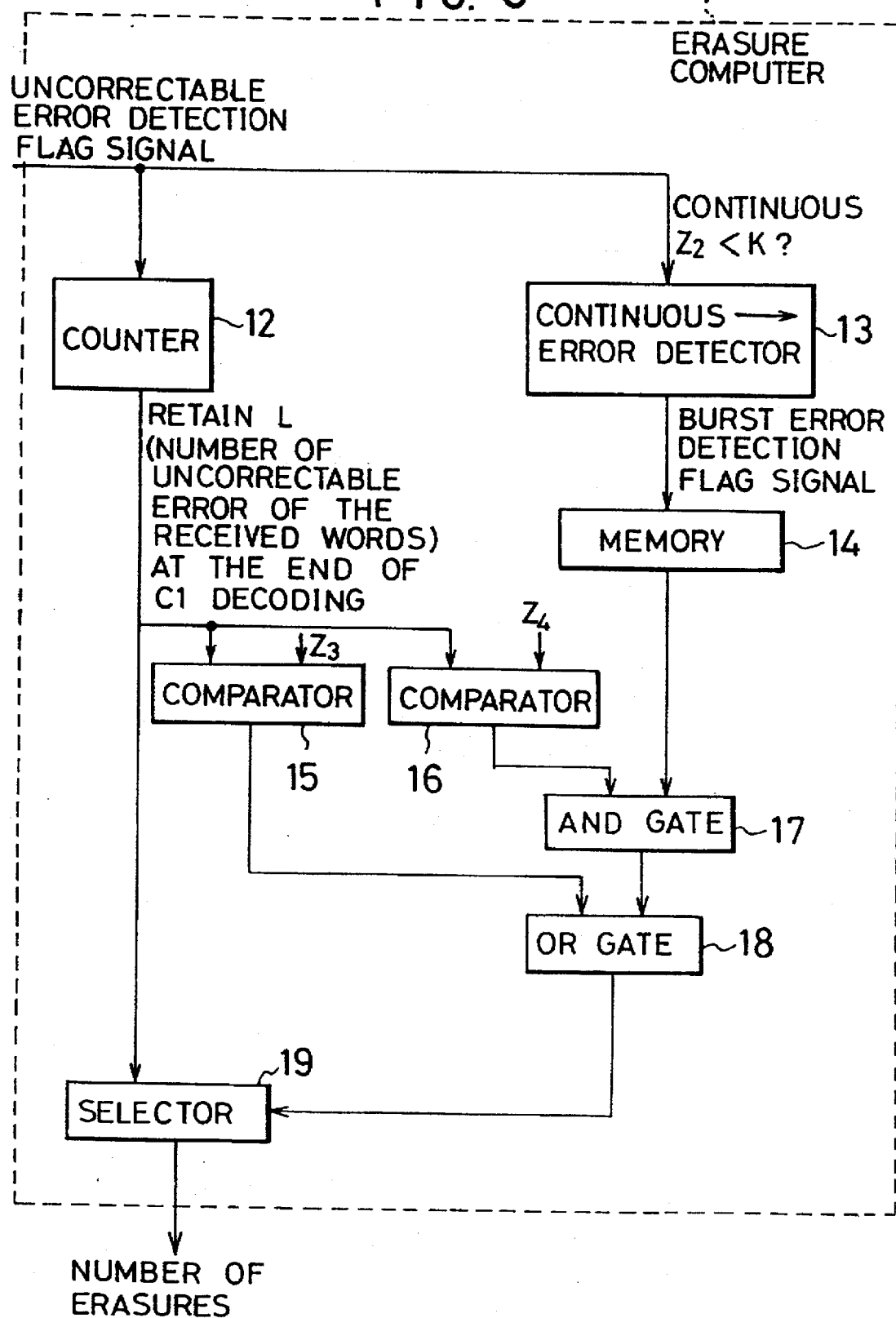
FIG. 6 gives the details of erasure computer of the error correcting decoder according to Embodiment 1 of the present invention.

The erasure computer 7 is detailed in a block diagram in FIG. 6, where;

a counter 12 counts the number of received words having an output signal of uncorrectable-error flags, a continuous-error detector 13 consisting of a counter and a comparator, outputs a signal of a burst error when a signal for uncorrectable-error flags is output for the continuous received words of predetermined value. Signals of burst errors are retained in a memory 14, comparators 15 and 16 compare the value output from the counter 12 at the end of C1 decoding with the predetermined values $Z_3$ and $Z_4$. An AND gate 17 combines the result of comparator 16 with memory 14. An OR gate 18 combines the output of comparator 15 with output of OR gate 17. A selector 19 outputs the number of erasures based on the output of the OR gate for C2 decoding.

FIG. 7 is an operational flowchart for error correction decoding thus far has been explained. $Z_1$, $Z_2$, $Z_3$, and $Z_4$ are the predetermined values.

The operation of the decoder is explained below with the flowchart shown in FIG. 7. In C1 decoding, a received-word sequence read from the memory is input through the input terminal 1 to the syndrome generator 2, by which a syndrome is computed. A received word here refers to signals contained in a single row in C1 direction or in a single column in C2 direction. The term "codeword" might be broadly accepted as an alternative to the term "received word". However, because a decoder receives a codeword, the term received word is used in lieu of codeword throughout this specification. The syndrome computed by the syndrome generator 2 is then input to the Euclid Algorithm operator 3, where a location polynomial is generated. Then the coefficients of error-location polynomial and of error-magnitude polynomial are computed. The coefficient of the error-location polynomial computed by the Euclid algorithm operator 3 is input to a degree computer 4 to compute and output a degree. The coefficients of the error-location polynomial and error-magnitude polynomial are input into Chien Search 5. The computed error-location is output through output terminal 9 while error-magnitude is output through output terminal 10. The number of errors $K_1$ is output to an error detector 6. If the degree of the error-location polynomial and the number of errors output from the Chien Search do not agree, or if the number of errors $K_1$ does exceed $Z_1$ (Step 3 in FIG. 7), a signal of uncorrectable-error flag is output from the output terminal 11 (S4).

The number of errors $K_1$ smaller than $Z_1$ (S1) indicates that the received words can be decoded. Thus when a signal of uncorrectable-error flag is not output through the output terminal 11 (Step 1 in FIG. 7), the content of the memory holding received symbols corresponding to the error location output from the output terminal 9 is added to the error magnitude output through the output terminal 10 and an error correction is carried out (S2). The counter of the continuous-error detector 13 in the erasure computer 7 is zero cleared.

On the other hand, when a signal of uncorrectable-error flag is output from the output terminal 11 (S3), the content of the memory holding the received words remains intact irrespective of error location or error magnitude.

A signal of uncorrectable-error flag input to the erasure computer 7 is counted up by the counter 12. The number of uncorrectable errors of the received words is counted without performing error correction. The content of the continuous-error detector 13 is also counted up. When a signal of uncorrectable-error flag is input to the erasure-location memory 8, the location of C1 code, e.g., the location of a row in this example, is memorized as the erasure location for C2 decoding.

When the abovementioned operation has been repeated for a block of a product code, for instance n times in rows if there are n rows in C1 direction, C1 decoding is complete.

When the value of the counter of the continuous-error detector 13 becomes greater than $Z_2$ during C1 decoding, a burst-error flag (continuous-error flag) is output (S5) and retained in the memory 14.

When C1 decoding is complete, the number of uncorrectable errors of the received words L, which could not be corrected during C1 decoding, is stored in the counter 12 of the erasure computer 7 (S6). When the value L output from the counter 12 is smaller than $Z_3$ (S7), or if the value L is smaller than $Z_4$ (S8) at the comparator 18 and the AND gate 17 and the continuous-error flag is on (S10), then erasure-and-error correction will be performed. The OR gate 18 selects the number of erasure symbols to be output from the selector 19 as the content of the counter 12, or else, zero is output so as to prevent erasure-and-error correction from being performed in C2 decoding.

For C2 decoding, the sequence read from the memory storing the received words decoded row by row will be input to the syndrome generator 2 from the input terminal 1 to calculate a syndrome.

The syndrome calculated by the syndrome generator 2 is input to the Euclid algorithm operator 3. With the value output from the erasure computer 7 as the number of erasures, and the value output from the erasure location memory 8 as the erasure location, the coefficients of the error-location polynomial and the error-magnitude polynomial are obtained.

The coefficient of the error-location polynomial calculated by the Euclid algorithm operator 3 is input to the degree computer 4, and the degree of the error-location polynomial is calculated and output. The coefficients of the error-location polynomial and error-magnitude polynomial calculated by the Euclid algorithm operator 3 are input to the Chien Search 5. There, error location and error magnitude are computed and output from the output terminals 9 and 10 respectively. The Chien Search also counts the number of errors and outputs its result.

If the degree of the error-location polynomial output from the degree computer 4 does not agree with the number of errors output from the Chien Search 5, a signal of uncorrectable-error flag is output from the output terminal 11. When the two values agree, the error magnitude output from the output terminal 10 is added to the content of the memory holding the received words decoded in C1 direction corresponding to the error location output from the output terminal 9, to perform error correction.

In this way, when there are high possibility of erroneous correction (S8), continuous-error flag (burst error) is closely checked, based the decision of whether to perform error correction ignoring erasures or to perform erasure-and-error correction.

An error-correcting decoder in accordance with present invention checks each row for a continuous uncorrectable error exceeding a first predetermined value. If the number of uncorrectable errors of the received word detected by the first decoder is between the second and the third predetermined values, the decoder then proceeds to perform erasure-and-error correction in the direction of column if there are continuously detected uncorrectable errors in C1 direction, whereas it performs only error correction if no continuous uncorrectable errors are detected.

The error-correcting decoder and the error-correction decoding method according to the present invention has the following advantages: The error-correction decoder serves the purpose of making efficient error correction, minimizing erroneous correction. By checking the number of uncorrectable errors of the received words row by row, the extent of erasure can be estimated. When an occurrence of continuous uncorrectable errors of the received words, or a burst error, appears to be highly likely, erasure-and-error correction is made in C2 decoding. When detected errors are judged to be random errors, and if there are many erasures, only error correction is made for it is less likely to result in erroneous correction.

Embodiment 2

Embodiment 1 gives an example of error correction decoding using a special purpose apparatus. This embodiment explains a method of performing error correction decoding using a general-purpose processor and memory shown in FIG. 4.

Figure 4:
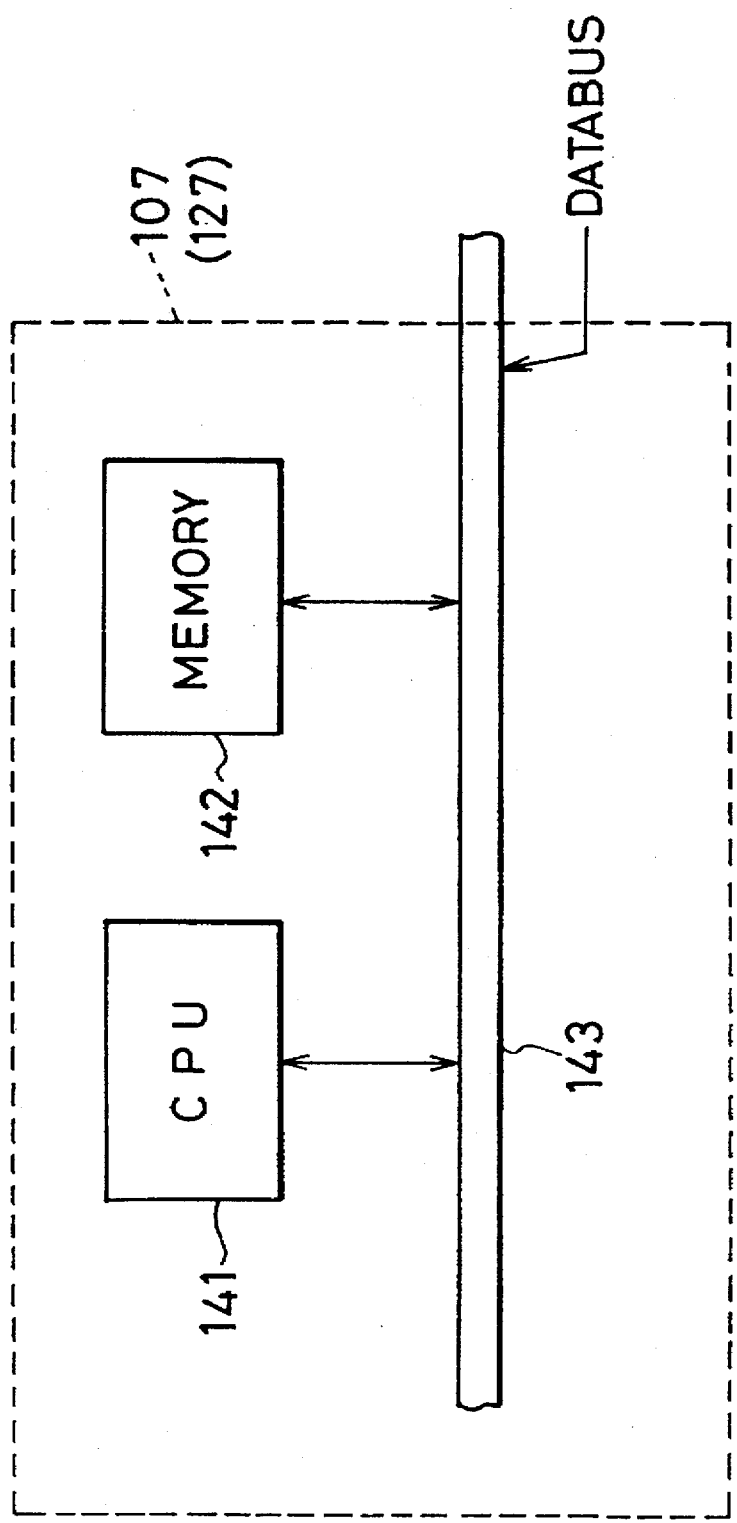
FIG. 4 shows S/W on general-purpose H/W.
Figure 8:
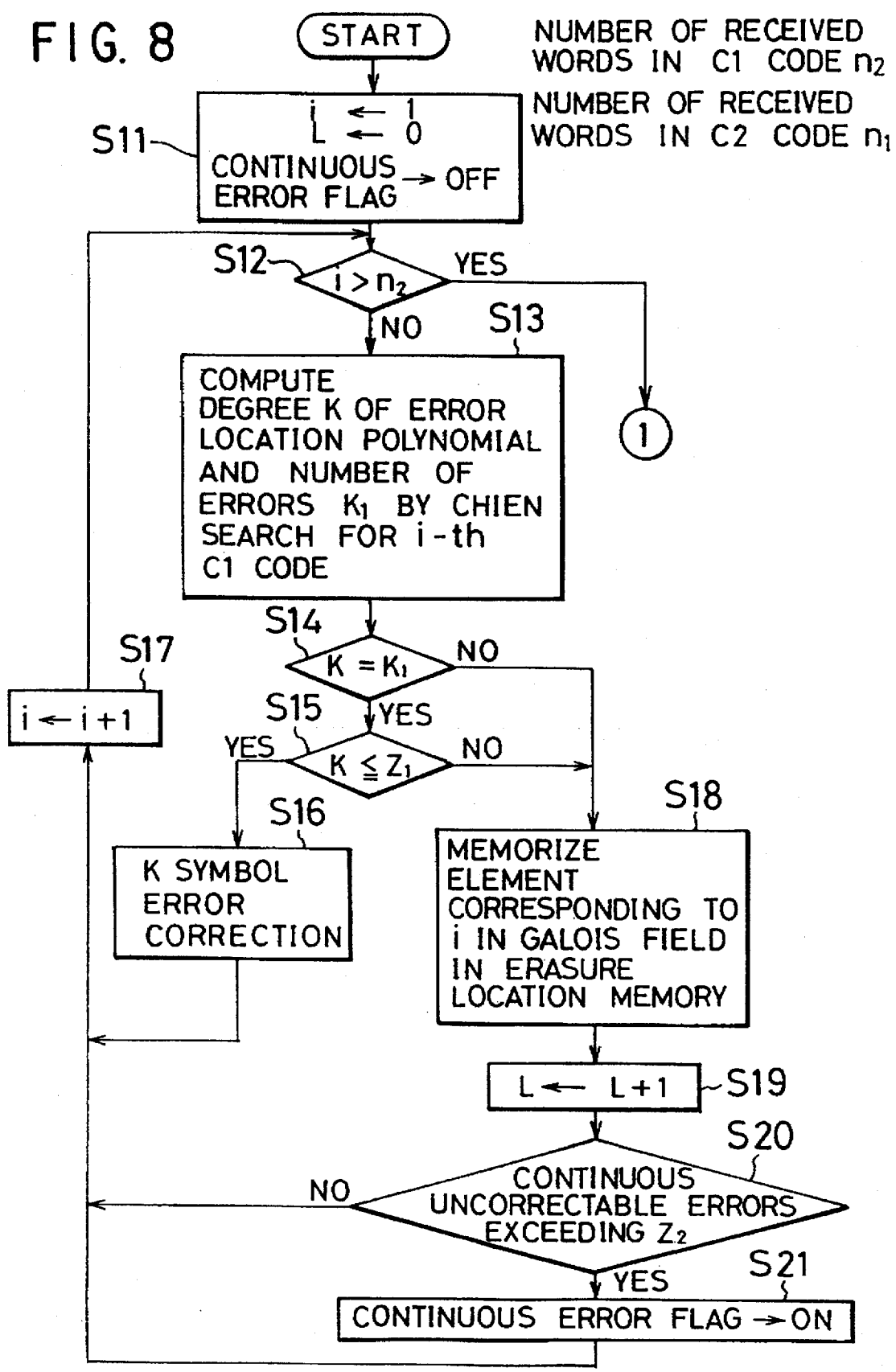
FIG. 8 is an operational flowchart of error correction decoding method according to Embodiment 2 of the present invention.
Figure 9:
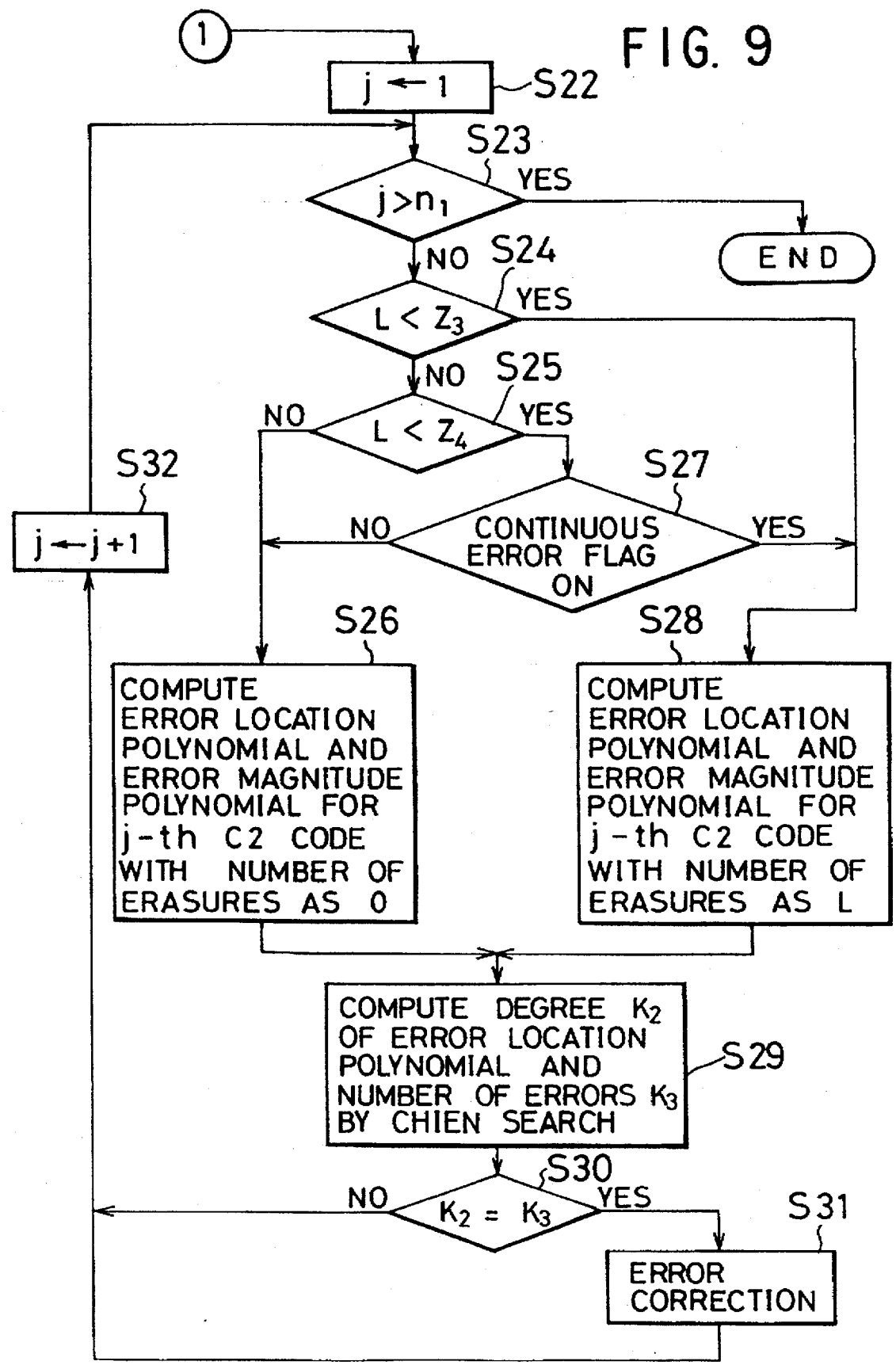
FIG. 9 is an operational flowchart of error correction decoding method according to Embodiment 2 of the present invention.

The configuration for this embodiment is shown in FIG. 4, and operational flowchart is shown in FIGS. 8 and 9.

Throughout the embodiments, it is assumed that the number of received words in C1 code, or in rows, to be n2 and n1 for C2 code, in columns. Received words are first decoded in C1 direction, in rows.

In FIG. 8 at step 11, decoding is started at row 1 of C1 code and error detection is operated by Euclid algorithm at step 13. The location polynomial is calculated by Chien Search and error location and error magnitude are obtained. The number of errors $K_1$ is obtained by counting the number of error locations. If the value obtained at step 15 is within the error correctable range, error correction is carried out at step 16, and decoding moves on to the next row at step 17.

Error detection and error correction will be repeated until all n2 rows will be covered at step 12. Errors judged to be uncorrectable are detected at step 14 and step 15, and their locations are written at step 18 as the elements corresponding to i in a Galois field.

The number of uncorrectable errors of the received words is integrated at step 19. At step 20, a judgement is made whether or not a burst error has occurred. When the number of uncorrectable errors of the received words exceed $Z_2$, a continuous-error flag is set on at step 21.

At step 17, a new row is started to be decoded. After C1 code is decoded n2 times in the direction of rows, C2 code is decoded n1 times in the direction of columns as shown in FIG. 9.

At step 22, C2 decoding starts at column 1. At step 24, if the value L is smaller than $Z_3$, computation is performed by the Euclid algorithm operator at step 28 to perform erasure-and-error correction. Namely, error-location and error-magnitude for C2 direction are obtained.

If the value L in C1 decoding exceeds $Z_4$ at step 25, only error correction computation is conducted at step 26 assuming that there are no erasures.

If the value L is between $Z_3$ and $Z_4$, then the presence of continuous-error flag is checked at step 27. Error correction computation is performed either at step 26 or at step 28. In this example, the degree of error-location polynomial and the number of memorized errors are computed at step 29. If these values agree at step 30, error correction is made at step 31.

Decoding will then proceed on to the next column at step 32, and the above operation is repeated n1 times in C2 direction.

An error correction decoding method according to present invention is that a code signal is decoded n2 times in the first direction of C1. The presence of continuous uncorrectable errors exceeding the first predetermined value is checked and the number of uncorrectable errors of the received word is compared whether it is in between the second and third predetermined values prior to C2 decoding. When the number of uncorrectable errors detected in the C1 direction is indeed between the second and third predetermined values, and there are continuous uncorrectable errors exceeding the first predetermined value, then erasure-and-error correction is performed, while only error correction is implemented ignoring erasures if the number of continuous uncorrectable errors is smaller than the first predetermined value.

The extent of erasure is determined by checking the number of uncorrectable errors of the received words in C1 decoding and a possible occurrence of a burst error is stored by checking the presence of continuous uncorrectable errors of the received words. When a burst error appears to have occurred, erasure-and-error correction is performed according to the values memorized. When random errors are likely to have occurred and there are many uncorrectable errors of the received words, only error correction is made so as to avoid the received words from getting erroneously corrected.

Embodiment 3

The theory of an error correction decoder for embodiment 3 is explained below. In C1 decoding, a large number of received words for which error correction is made to the full capacity, up to the maximum-correctable-error value determined by the length of each word compared to the length of the error correction code for each word is invariably associated with the large number of erroneous corrections. In this case, error correction is performed ignoring erasures because erasure-and-error correction would more likely result in more erroneous correction for C2 decoding. Likewise, when the number of received words for which error correction is performed up to its full capacity is small, it is regarded that there is less erroneous correction. Thus, erasure-and-error correction is selected for C2 decoding because the likelihood of erroneous correction is low.

Figure 10:
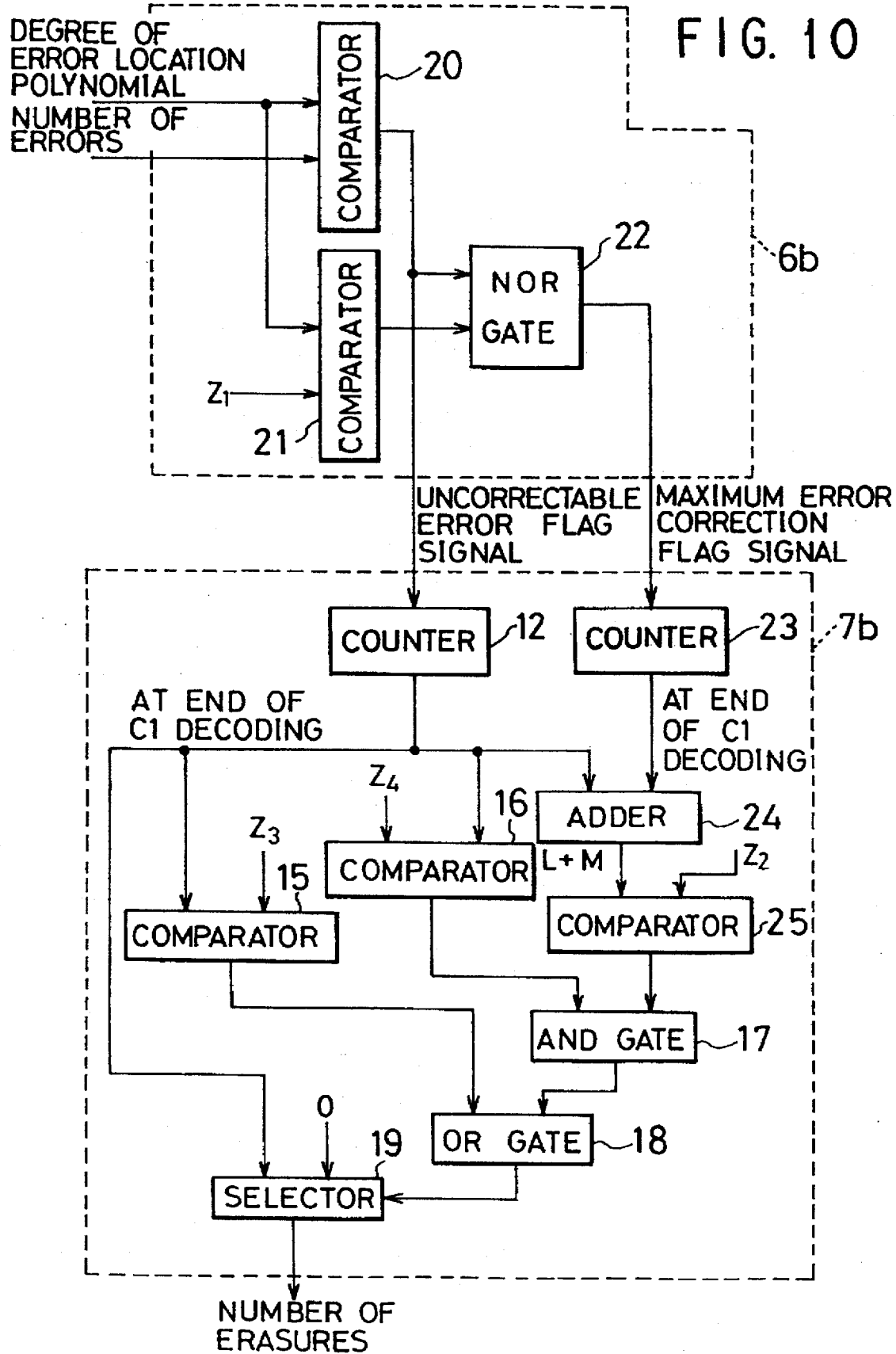
FIG. 10 shows the details of error detector and erasure computer of error correcting decoder according to Embodiment 3 of the present invention.

FIG. 10 is a block diagram showing the details of an error detector 6b and an erasure computer 7b shown in FIG. 5. The error detector 6b is made up of three basic components: two comparators 20 and 21, and a NOR gate 22. The comparator 20 compares a degree of an error-location polynomial with the number of errors computed by the Chien Search. The other comparator 21 compares the degree of an error-location polynomial with the number of errors for which maximum-error correction has been performed in C1 decoding. A counter 23 counts the number of received words for which maximum-correctable-error value is performed. An adder 24 adds the sum of final outputs from the counter 12 and counter 23, e.g., the number of uncorrectable errors of the received words detected in C1 decoding, to the number of received words for which maximum-error correction is performed. A comparator 25 compares the output from the adder 24 with the predetermined value $Z_2$.

FIG. 11 shows an example of error correction in accordance with the error correcting decoder explained in Embodiment 3. In this flowchart, values $Z_1$, $Z_2$, $Z_3$, and $Z_4$ are predetermined.

Here operations of the error detector 6b and the erasure computer 7b only are illustrated because all other operational functions of this embodiment is the same as explained in Embodiment 1.

A degree of an error-location polynomial computed by the degree computer 4 and the number of errors K computed by Chien Search 5 are input to the error detector 6b. The comparator 20 compares the degree with the value K and outputs a signal of uncorrectable-error flag (S47) if the two values are not equal. The comparator 21 compares the degree with the maximum-correctable-error value $Z_1$ and outputs a signal if the two values are not equal. When the two values agree (S43), a signal of maximum-error-correction flag is output from the NOR gate 22 (S48) instead of a signal of uncorrectable-error flag.

When a signal of uncorrectable-error flag is input to the counter 12, the number of uncorrectable errors of the received words in C1 decoding is integrated. A signal of maximum-error-correction flag is input for each decoded row and integrated at counter 23. When decoding of a row has been repeated n2 times, when C1 decoding has been complete, the number of received words for which maximum error correction is performed M is counted (S49) by the counter 23.

When C1 decoding has finished, the value L output from the counter 12 is added to the value M output from the counter 23 by adder 24. Then, the comparator 25 outputs a signal if the value output from the adder 24 is less than $Z_2$ (S53). When the value output from the counter 12 is found to be smaller than $Z_3$ (S50) by the comparator 15, or if it found to be smaller than $Z_4$ (S51) by the comparator 16 and the AND gate 17, and when a signal has been output from the comparator 25 (S53), the possibility of erroneous correction is judged to be low. Via the OR gate 18, the value L output from the counter 12 is sent to the selector 19 as the number of erasure symbols, and erasure-and-error correction is performed for C2 decoding.

In other cases, when the possibility of erroneous correction is high, zero is output as the number of erasure symbols, and error correction only will be performed in C2 decoding assuming that there is no erasure.

Furthermore, the number of errors of the received word having the same maximum-correctable-error value is checked and then the number of uncorrectable errors of the received words is checked. If the number of uncorrectable errors of the received words detected in C1 decoding is in between the second and third predetermined values, the maximum-error-correction flag set in each row, or the sum of the maximum-error-correction flag set in each row and the number of uncorrectable errors of the received word detected in C1 decoding is compared with the fourth predetermined value. When the compared value is smaller than the fourth predetermined value, erasure-and-error correction is performed while only error correction is performed if the value is greater than the fourth predetermined value.

The extent of erasure is estimated by checking the number of received words exceeding the maximum-correctable-error value. If the number of received words with errors exceeding the maximum-correctable-error value is large, only error correction is made for C2 decoding so as to prevent the received words from getting erroneously corrected. If the number of received words with errors exceeding the maximum-correctable-error value is small, erasure-and-error correction is selected.

Embodiment 4

Although the value output from the counter 12 is added to the value output from the counter 23 by the adder 24 before being input to the comparator 25 in Embodiment 3, it is equally effective to input the value output from the counter 23 to the comparator 25, by changing the predetermined value $Z_2$.

Furthermore, the number of uncorrectable errors of the received words detected in rows is calculated and then the number of received words having the same maximum-correctable-error value determined by the design distance based on the decoded result is checked. If the number of uncorrectable errors of the received words is between the second and third predetermined values, then the maximum-error-correction flag set in each row, or the sum of the maximum-error-correction flag set in each row and the number of uncorrectable errors of the received words in rows is compared with the fourth predetermined value. When the number is smaller than the fourth predetermined value, erasure-and-error correction is implemented. If the value is greater than the fourth predetermined value, error correction is carried out ignoring erasures.

The number of received words having errors exceeding the maximum-correctable-error value in C1 direction is determined. When many received words having errors exceeding the maximum-correctable-error value are detected, only error correction is made to prevent the received words from getting erroneously corrected while erasure-and-error correction is performed when the number of received words with errors exceeding the maximum-correctable-error value is negligible.

Embodiment 5

Figure 12:
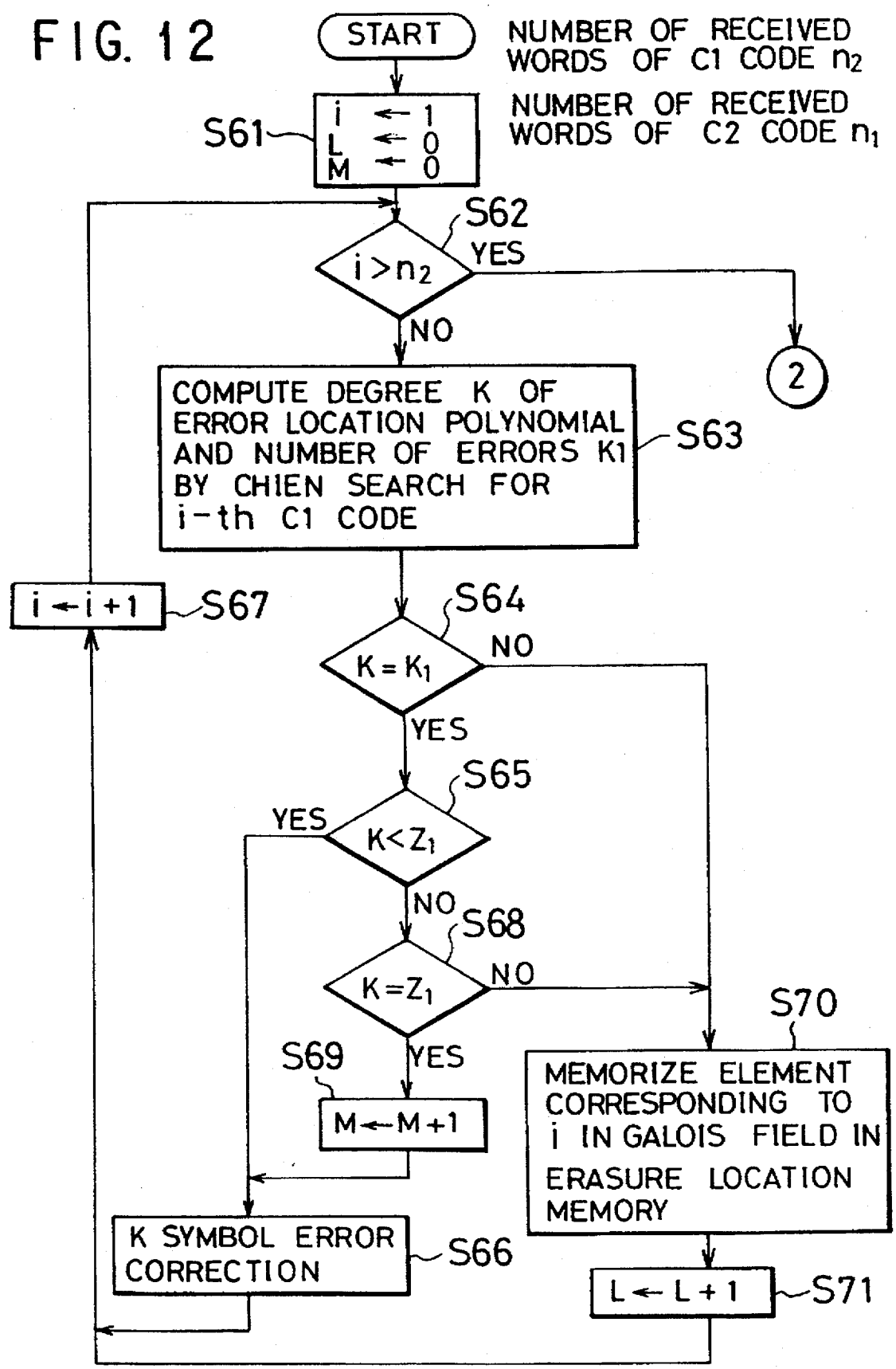
FIG. 12 is an operational flowchart of error correction decoding method according to Embodiment 5 of the present invention.
Figure 13:
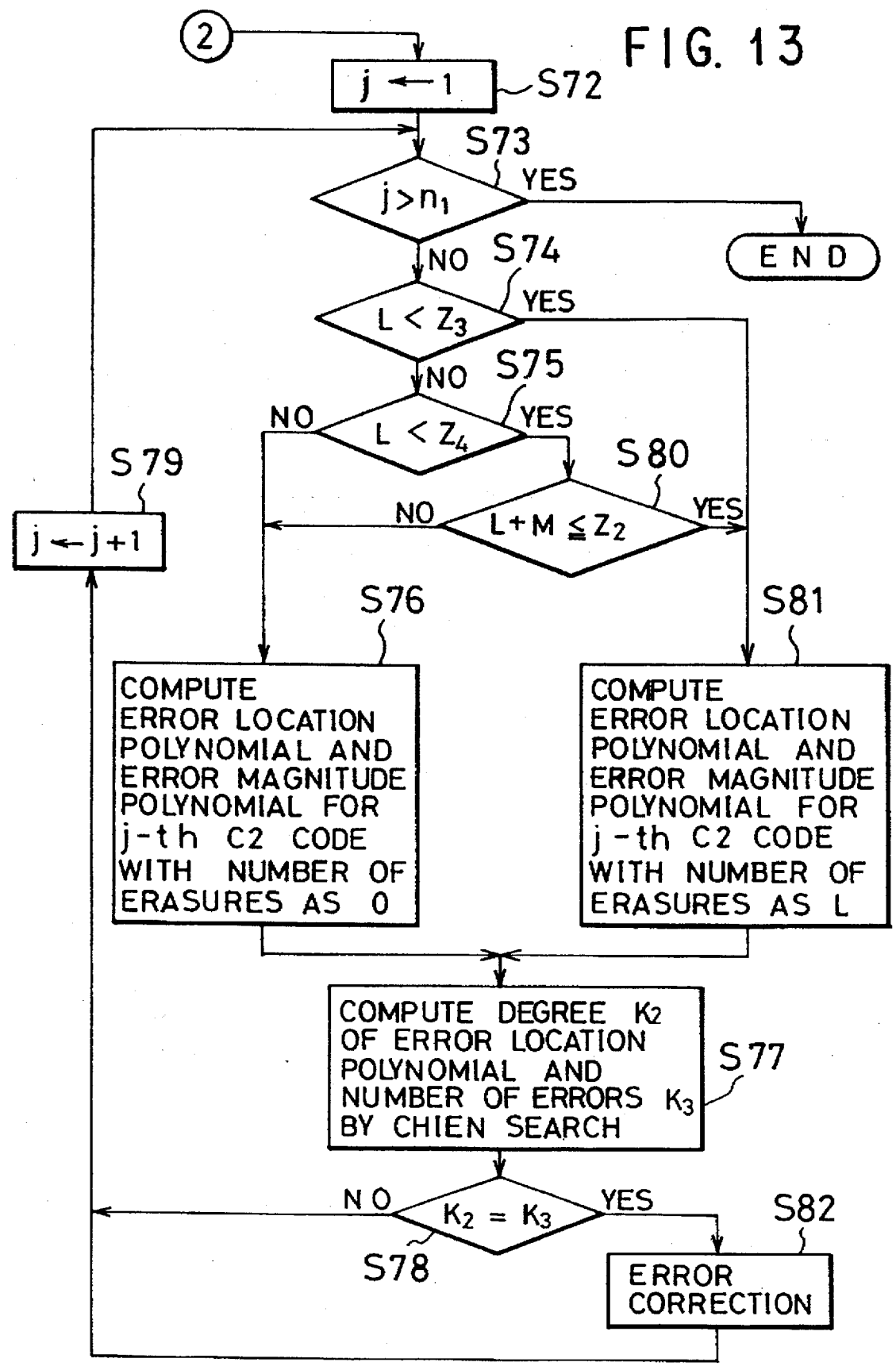
FIG. 13 is an operational flowchart of error correction decoding method according to Embodiment 5 of the present invention.

Embodiment 5 describes an example of error correction decoding method with a general-purpose processor and a memory shown in FIG. 4, using the operational flowchart shown in FIGS. 12 and 13.

At step 61, decoding starts at row 1. At step 63, error detection is operated by Euclid algorithm: the coefficient of error-location polynomial is input to obtain error location and error magnitude. At step 65, if it is proven to be within a range that decoding can be done, error correction starts at step 66, and then moved on to the next row at step 67.

Error detection and error correction will be repeated from step 62 until all n2 rows are decoded. Received words decided as uncorrectable are detected at steps 64 and 65, and their locations are written as the elements corresponding to i in a Galois field at step 70.

The maximum-correctable-error value is counted as a maximum error-correction flag at step 69 and the number of uncorrectable errors of the received words L are integrated at step 71.

At step 67, decoding will move on to the next row. When C1 code is decoded n2 times in direction of rows, C2 code will be decoded n1 times in direction of columns, as shown in FIG. 13.

At step 72 of FIG. 13, C2 decoding begins at column 1. If the number of uncorrectable error of the received words L is less than $Z_3$ (S74), erasure-and-error correction computation is carried out by the Euclid algorithm operator (S81).

If the value L in C1 decoding is greater than $Z_4$ (S75) then if the sum of L and M is less than or equal to $Z_2$ (S80), error correction computation only is performed (S81) ignoring erasures at step 76.

If the value L is in between $Z_3$ and $Z_4$, then the sum of the value L and the maximum error-correction flags, or the maximum error-correction flags is checked whether it is smaller than the predetermined value, based on which error correction computation is performed either at step 76 or at step 81.

When the degree of error-location polynomial (S77) agrees with the number of errors computed by Chien Search (S78), error correction is made at step 82.

Decoding moves on to the next column at step 79 and the operation is repeated n1 times in direction of column for C2 code (S73).

Furthermore, the number of uncorrectable errors of the received words in rows is checked. Then, in C2 decoding, assuming that there is no erasure, an error-location polynomial is generated. If the degree of the polynomial is smaller than the first predetermined value, error correction is implemented. If the degree is greater than the first predetermined value, the number of the uncorrectable errors of the received words in rows is compared with the second predetermined value. If the number is smaller than the second predetermined value, re-calculation is made using the error locations in the location memory to perform erasure-and-error correction for C2 direction. If the value is greater than the second predetermined value, error correction is performed in C2 direction ignoring erasures.

Furthermore, error correction is made for C2 decoding assuming that erasures are none. Based on the result, the degree of error-location polynomial is greater than a certain value, error correction is again performed using the erasure locations. Random errors are corrected minimizing the possible erroneous correction, while erasure-and-error correction is made when burst errors have occurred.

Embodiment 6

Embodiment 6 is based on the following theory: When random errors have occurred, most erasures detected in C1 decoding are not actual errors. If erroneous correction has been made in C1 decoding, and if erasure correction is made for C2 decoding, the possibility of erroneous correction becomes highly likely. Rather, received words can be decoded by error correction ignoring erasures. On the other hand, when burst errors have occurred, erasures in C1 decoding are actually incorrect. Therefore it is erasure-and-error correction, and not error correction that makes C2 decoding possible. Based on this theory, error correction is made first ignoring erasures regardless of a burst or a random error. Then, the degree of an error-location polynomial proved to be greater than a predetermined value is taken as an occurrence of a burst error. Thus an error correction decoder in accordance with this embodiment remarkably improves the error correction capability by making error correction using the erasure locations.

Figure 14:
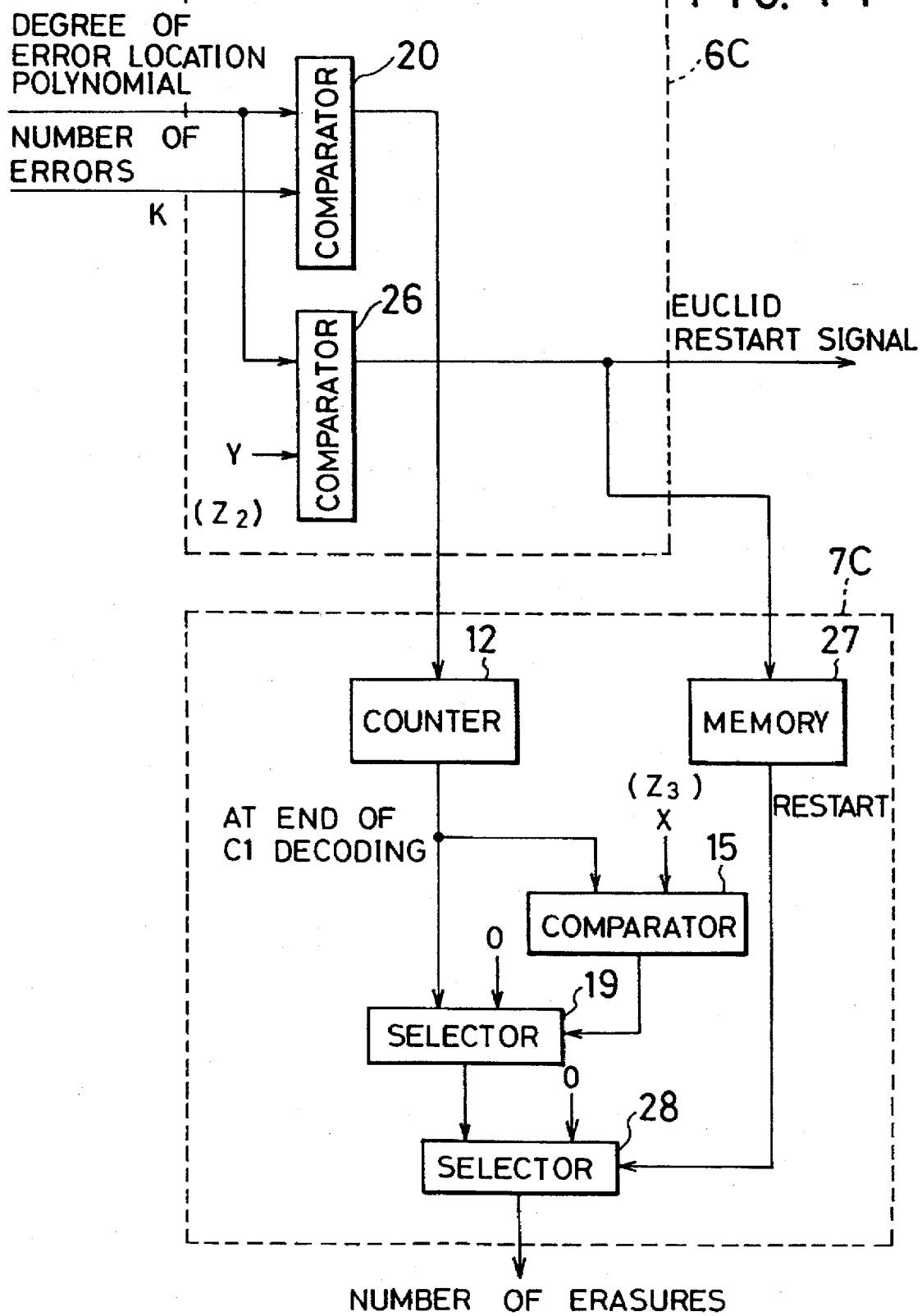
FIG. 14 gives the details of error detector and erasure computer of error correcting decoder according to Embodiment 6 of the present invention.

Configuration for this embodiment is the same as that for embodiment 1 except for the error detector and the erasure computer. FIG. 14 is a block diagram showing the details of an error detector 6c and an erasure computer 7c. In FIG. 14, 6c represents the error detector while 7c shows the erasure computer. A comparator 26 compares the degree of error-location polynomial with a predetermined value, and outputs a Euclid restart signal if the degree is greater than the value. Euclid restart signals are stored in a memory 27, and the number of erasures is switched by a selector 28 depending on the presence of an Euclid restart signal. This Euclid restart signal is also input to the Euclid algorithm operator 3.

Figure 15:
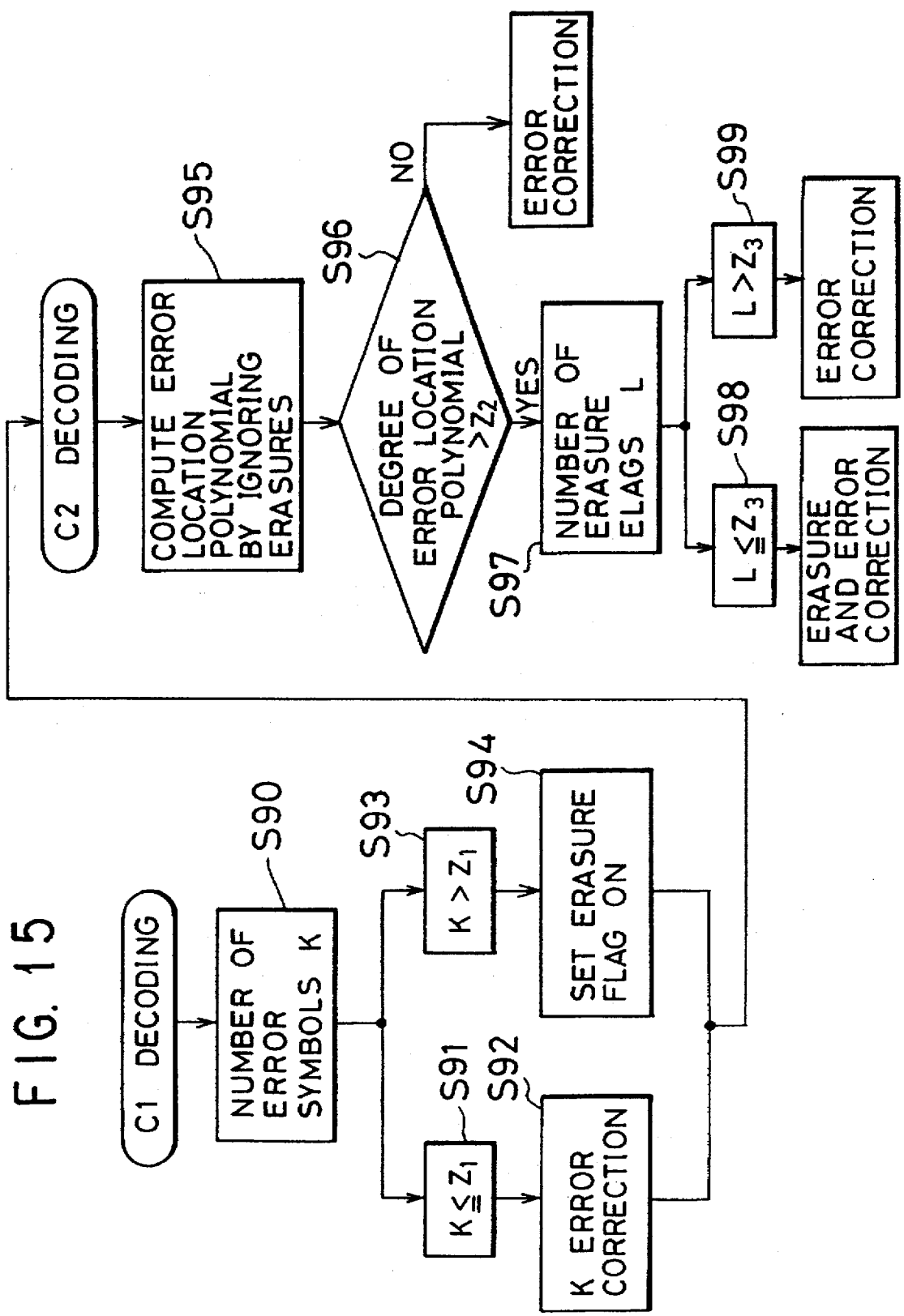
FIG. 15 is an operational flowchart of error correcting decoder according to Embodiment 6 of the present invention.

A flowchart shown in FIG. 15 gives an example of error correction decoding method in accordance with Embodiment 6. In FIG. 15, values $Z_1$, $Z_2$, and $Z_3$ are predetermined. As in case of Embodiment 3, operations of the error detector 6c and the erasure computer 7c are explained since all other operational functions of this embodiment is the same as explained in Embodiment 1.

The degree of error-location polynomial computed by the degree computer 4 and the number of errors computed by Chien Search 5 are input to the error detector 6c. If the value K is greater than $Z_1$ (S93), a signal of uncorrectable-error flag is output from the comparator 20 (S94), just as in the case when the number of errors is greater than $Z_1$. If $K=<Z_1$ (S91), normal error correction is performed (S92). When a signal of uncorrectable-error flag is input to the counter 12, the erasure computer 7c counts the number of uncorrectable errors of the received words in C1 decoding. When this operation is repeated n2 times, C1 decoding is complete, and the total of uncorrectable errors of the received words are integrated at counter 12.

When C1 decoding has been complete, the number of uncorrectable errors of the received words L is stored in the counter 12 of the erasure computer 7c. If the value output from the counter 12 is less than $Z_3$, the comparator 15 selects the number of erasure symbols to be output from the selector 19.

When zero is output from the selector 28 (S95), error correction starts for C2 decoding. In other words, error correction is performed ignoring erasures detected in C1 decoding. Based on the error-location polynomial computed by the Euclid algorithm operator, a degree of an error-location polynomial is computed (S96) at the degree computer 4. When the comparator 26 finds that the degree is greater than $Z_2$, a Euclid restart signal is output (S97).

An output Euclid restart signal is stored in the memory 27. The selector 28 switches the value output from the selector 19 as the number of erasures. The syndrome computed by the syndrome generator 2 is reloaded into the Euclid algorithm operator 3. Based on the number of erasures (S97) output from the erasure computer 7c, the Euclid algorithm operator 3 reads erasure locations from the erasure location memory 8 to perform erasure-and-error correction.

In this way, first error correction is made ignoring erasures. If the degree of an error-location polynomial is increased as a result of error correction, error locations are employed to re-make error correction.

In addition, the number of uncorrectable errors of the received words detected in rows is checked. Assuming that there is no erasure for C2 decoding, an error-location polynomial is generated so as to compare the degree of the error-location polynomial with the first predetermined value. If the degree is greater than the first predetermined value, then the number of uncorrectable errors of the received words in rows is compared with the second predetermined value. If the number is smaller than the second predetermined value, re-calculation is performed using the locations in the location memory, and erasure-and-error correction is made. If the value is greater than the second predetermined value, error correction is performed ignoring erasures.

Moreover, error correction is made for C2 decoding assuming that there is no erasure. Based on the result, if the degree of error-location polynomial is greater than a certain value, error correction is performed again using the erasure locations. Thus random errors are corrected minimizing the possible erroneous correction while erasure-and-error correction is made when burst errors have occurred.

Embodiment 7

In the previous embodiment, the comparator 15 decides whether to output the number of uncorrectable errors of the received words or zero from the selector 19. It is also highly possible to realize the same signaling effect by choosing the output from the selector 19 from wider a range of output values including the continuous-error detector, signals of the maximum error-correction flags, and so on as has been explained in Embodiment 1 and Embodiment 3.

Based on the result of the C1 decoding, the received words will be decoded in C2 direction. Errors left uncorrected in C1 decoding will be re-calculated on the basis of the received words corrected in C2 decoding.

It is highly likely that received words that can not be corrected in C2 decoding are the received words that could not be corrected in C1 decoding. Because error correction is made again only for the received words that could not be corrected in C1 decoding using the received words obtained in C2 decoding, error correction decoding can be performed effectively in a time-saving manner, with few erroneous correction.

Embodiment 8

Embodiment 8 enlarges upon an example of an error correction decoding method elaborated in Embodiment 6, with a general-purpose processor and a memory shown in FIG. 4.

Figure 16:
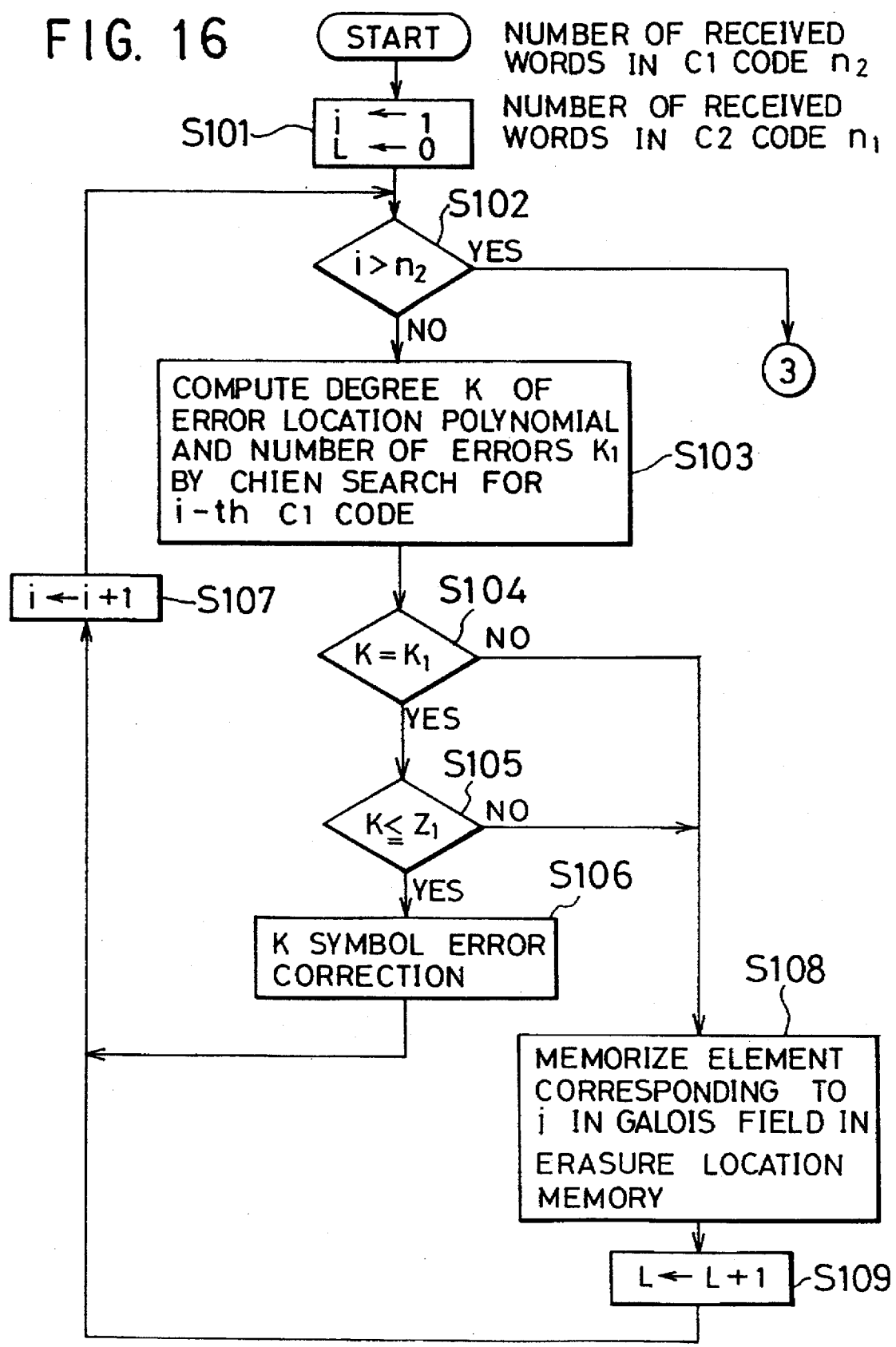
FIG. 16 is an operational flowchart of error correction decoding method according to Embodiment 8 of the present invention.
Figure 17:
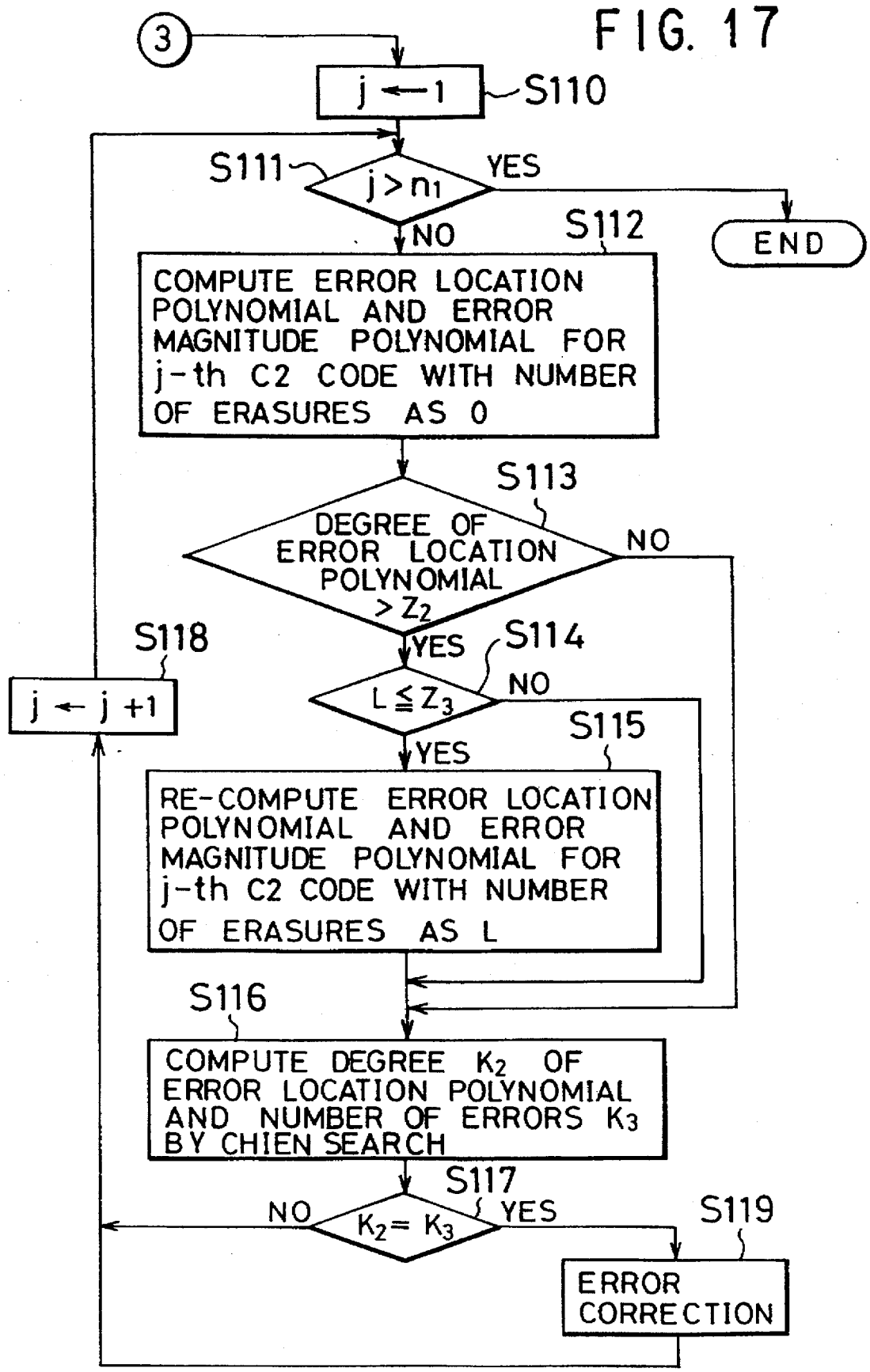
FIG. 17 is an operational flowchart of error correction decoding method according to Embodiment 8 of the present invention.

FIGS. 16 and 17 are the operational flowchart. At step 101, decoding starts for the received words at row 1, in C1 direction, and error detection is operated based on the Euclid algorithm at step 103. If errors detected are within a range that can be decoded, error correction is made at step 106, and then decoding will move on to the next row (S107).

Error detection and error correction will be repeated until all rows, e.g., n2 rows will have been decoded. The received words judged to be uncorrectable are detected at step 104 and Step 105, and their locations are written in the location memory at step 108. The value L are integrated at step 109.

Decoding moves on to the next row at step 107. When C1 codes have been decoded n2 times in direction of X, C2 code will be decoded n1 times in direction of Y as illustrated in FIG. 17.

At step 110, decoding will start for C2 codes at column 1. An error-location polynomial is computed at step 112 assuming that no erasure had occurred in C1 decoding. The operation at step 113 is very important. If the degree of the error-location polynomial computed by ignoring the erasure is less than $Z_2$, the degree is compared with the number of errors at step 116, and error correction is made at step 119.

On the other hand, if the degree of error-location polynomial is greater than $Z_2$, the number of error-detection flags is compared with $Z_3$ at step 114. If the number of error-detection flags is smaller, the possibility of erroneous correction is estimated to be low. Then the number of error detection is reset and the error-location polynomial is re-computed at step 115.

If the degree is greater than $Z_3$, only error correction is made at step 119 ignoring erasures.

Decoding will move on to the next column at step 118, and the avobementioned operation is repeated n1 times for C2 codes in direction of column.

Embodiment 9

It is conceivable that errors could remain uncorrected after C1 and C2 decoding is done. Those errors are most likely to be the received words that could not be corrected in C1 decoding. Based on this theory, this embodiment gives an example of a decoding method that serves an efficient and time-saving error correction by making decoding again only for the errors of the received words that could not be corrected in C1 decoding.

After the product code has been decoded, memory addresses at which decoded C1 and C2 information has been stored are read according to the error-location information to re-perform error correction for the received words that were detected but left uncorrected in C1 decoding.

Figure 18:
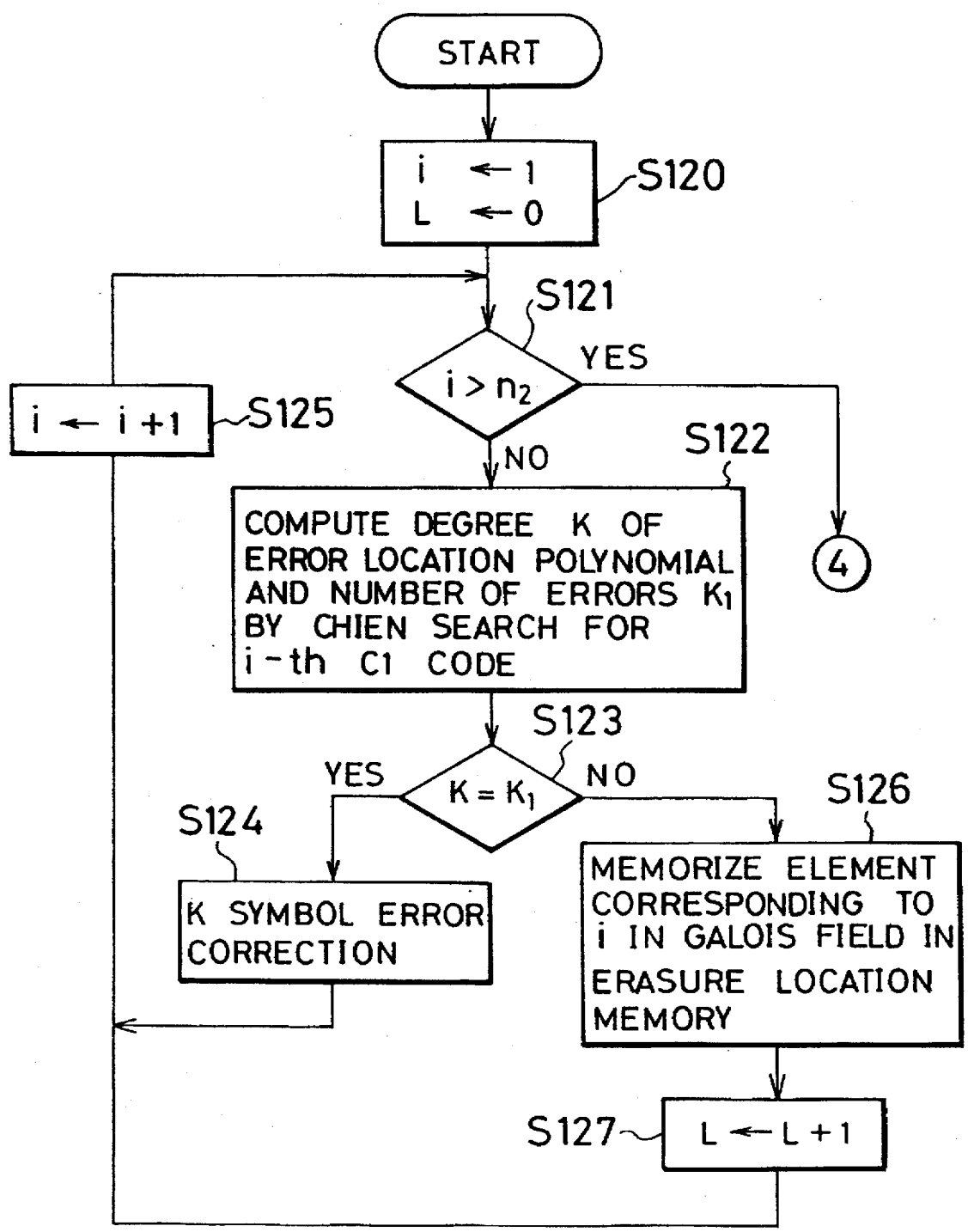
FIG. 18 is an operational flowchart of error correction decoding method according to Embodiment 9 of the present invention.
Figure 19:
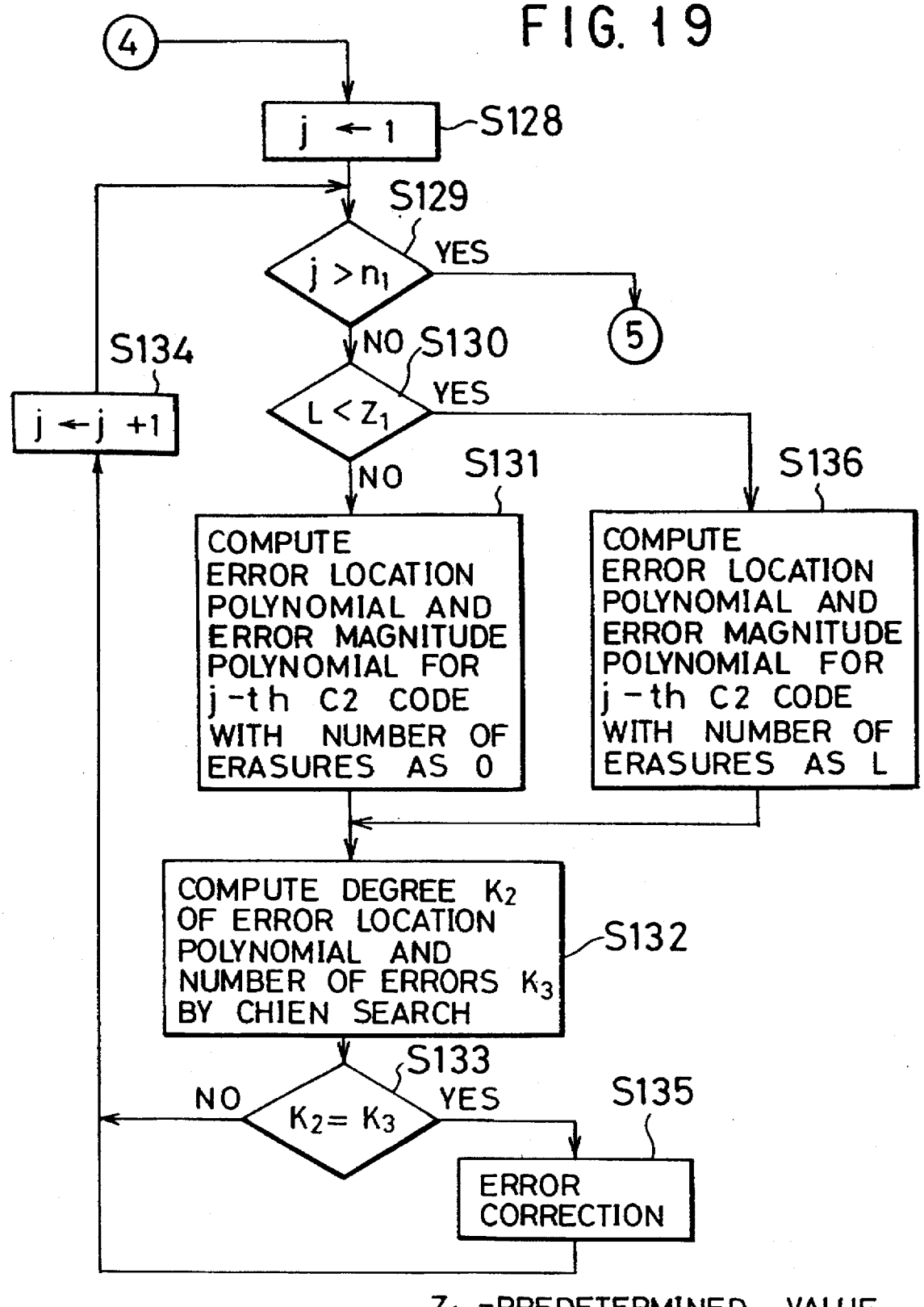
FIG. 19 is an operational flowchart of error correction decoding method according to Embodiment 9 of the present invention.
Figure 20:
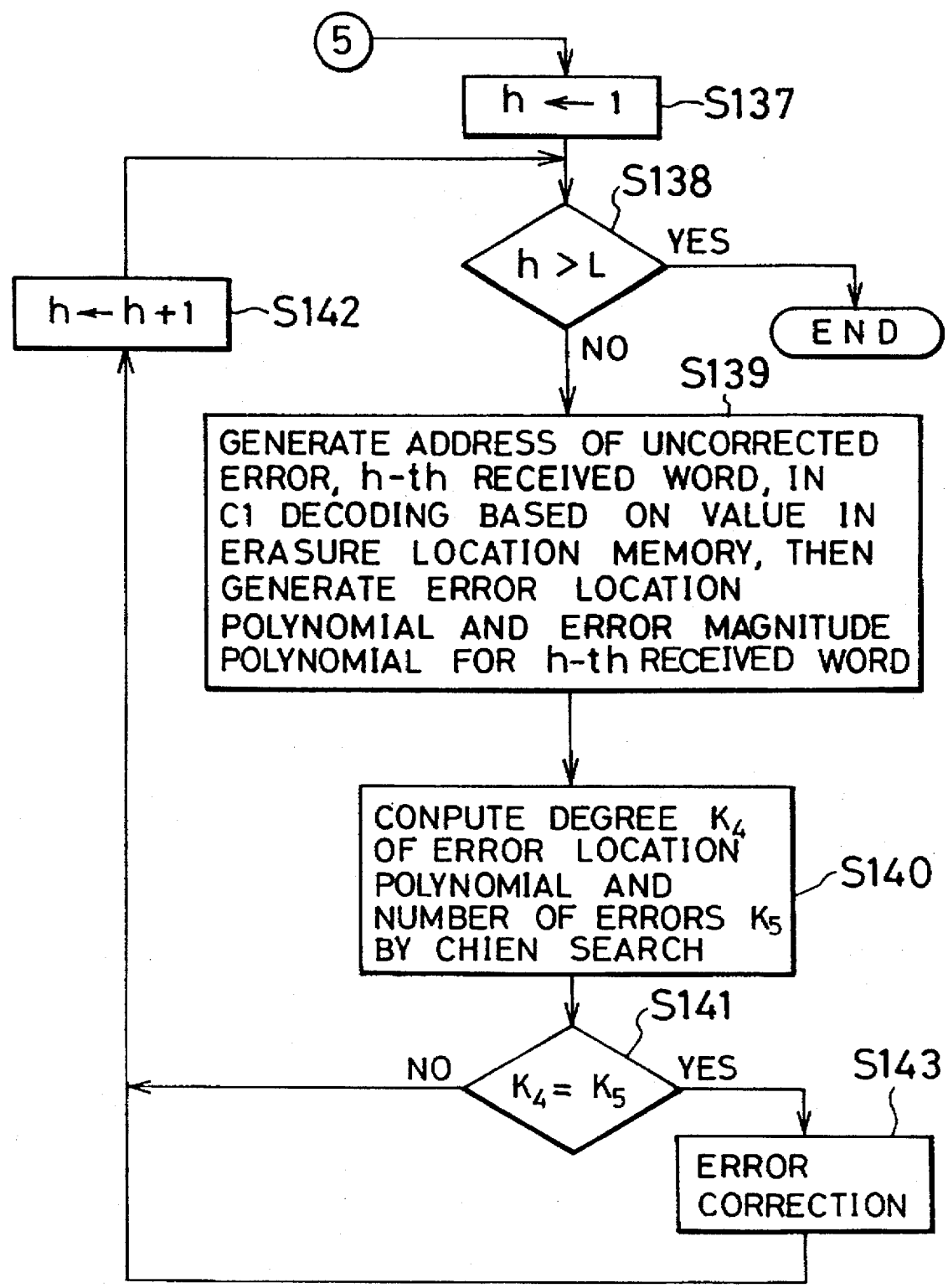
FIG. 20 is an operational flowchart of error correction decoding method according to Embodiment 9 of the present invention.
Figure 21:
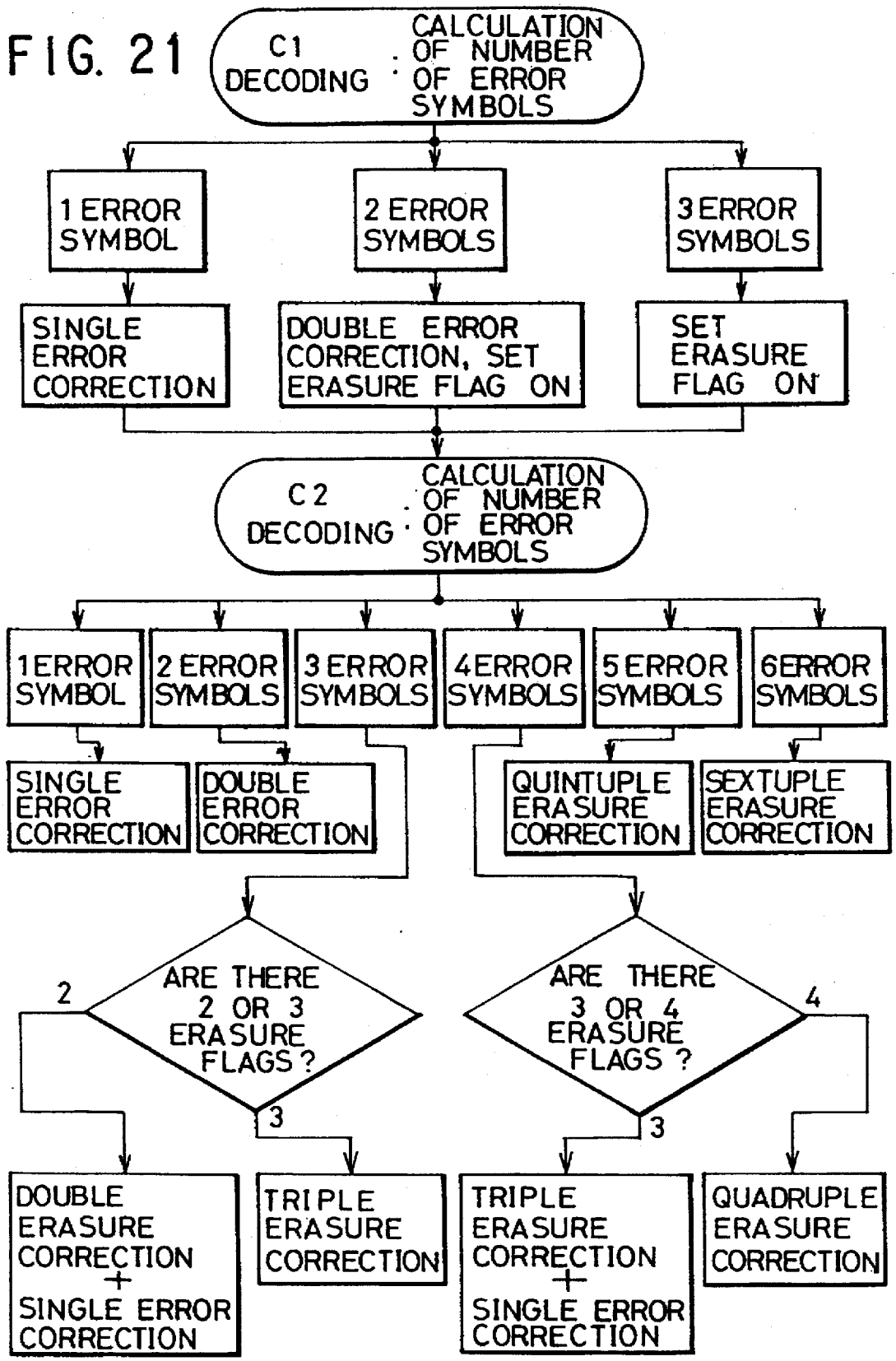
FIG. 21 outlines a conventional error correction decoding method.

Operational flowchart for this embodiment is shown in FIGS. 18, 19, and 20.

Decoding will start first for C1 codes at row 1 at step 120. At step 122, error detection is operated by means of Euclid algorithm. If the detected errors are within the decodable range, error correction is made at step 124 and decoding will move on to the next row at step 125.

Error detection and error correction are repeated until all n2 rows are decoded (Step 121). Locations of the received words detected as uncorrectable at step 123 are written in the memory at step 126, and the number of uncorrectable errors of the received words L is integrated at step 127.

Decoding will move on to the next row at step 125. After C1 code has been decoded n2 times in direction of X, C2 code is decoded n1 times in direction of Y as illustrated in FIG. 19.

Decoding will start at column 1 of C2 code at step 128. If the number of uncorrectable errors of the received word is greater than $Z_1$, error-location polynomial and error-magnitude polynomial are computed at step 131 assuming that there is no erasure. When it is less than $Z_1$, error-location and error-magnitude polynomials are computed based on the number of uncorrectable errors of the received words at step 136. Then at step 135, error correction is performed based on the above computation.

Upon completion of the computation for all n1 columns, received words are once again checked from the beginning at step 137. Then error-location and error-magnitude polynomials are computed for the received words of which errors could not be corrected in C1 decoding.

In this way, based on the value obtained as a result of C2 decoding, error correction is performed at step 143 and codes assumed to be correct are obtained.

This operation is repeated L times, namely, the number of times errors of the received words that could not be corrected in C1 decoding at step 142.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An error-correcting decoder for decoding a code signal composed of n2 rows×n1 columns of symbols including error-correction codes for one of error-correction and erasure-and-error correction, and for correcting errors in the code signal based on the error-correction codes, comprising;

(A) a first decoder for correcting errors of each row, and for detecting an uncorrectable-error of each row;

(B) a flag memory, connected to the first decoder, for setting a burst-error flag on when a number of detected consecutive uncorrectable-errors of a row exceeds a first predetermined value;

(C) a location memory, connected to the first decoder, for memorizing locations of rows having uncorrectable-errors detected by the first decoder;

(D) a counter, connected to the first decoder, for counting a number of rows having uncorrectable-errors detected by the first decoder; and (E) a second decoder, connected to the first decoder, for correcting errors of each column, for decoding a column based on erasure-and-error correction using the locations in the location memory in the case that the burst-error flag is set on, and that the number in the counter is between second and third predetermined values, and for decoding the column based on error-correction in the case that the number in the counter is between the second and third predetermined values, and that the burst-error flag is off.

2. An error-correcting decoder for decoding a code signal composed of n2 rows×n1 columns of symbols including error-correction codes for one of error-correction and erasure-and-error correction, and for correcting errors in the code signal based on the error-correction codes, comprising;

(A) a first decoder for correcting errors of each row, and for detecting an uncorrectable-error of each row;

(B) a location memory, connected to the first decoder, for memorizing locations of rows having uncorrectable-errors detected by the first decoder;

(C) a first counter, connected to the first decoder, for counting a number of rows having uncorrectable errors detected by the first decoder;

(D) a second counter, connected to the first decoder, for counting a number of maximum error-correction flags, a maximum error-correction flag being set for a row when a number of detected errors of the symbols in the row is equal to a maximum-correctable-error value; and (E) a second decoder, connected to the first decoder, for correcting errors of each column, for decoding a column based on erasure-and-error correction using the locations in the location memory if the number in the first counter is between second and third predetermined values, and a sum of the number in the first counter plus the number in the second counter is less than a first predetermined value, and for decoding a column based on error-correction if the number in the first counter is between the second and third predetermined values, and the number of the first counter plus the number of the second counter is more than the first predetermined value.

3. The error-correcting decoder according to claim 2, wherein the second decoder decodes a column based on erasure-and-error correction using the locations in the location memory if the number in the first counter is between the second and third predetermined values, and the number in the second counter is less than a fourth predetermined value, and decodes a column based on error-correction if the number in the first counter is between the second and the third predetermined values, and the number of the second counter is more than the fourth predetermined value.

4. The error-correcting decoder according to claim 1 or claim 2, further comprising a degree calculator for calculating a degree of a Euclid algorithm, wherein the degree calculator sets a row as an uncorrectable error row when the degree in the degree calculator is different from a number of error-locations detected in the Chien-Search circuit in a row.

5. An error-correcting decoder for decoding a code signal composed of n2 rows×n1 columns of symbols including error-correction codes for one of error-correction and erasure-and-error correction, and for correcting errors in the code signal based on the error-correction codes, comprising;

(A) a first decoder for correcting errors of each row, and for detecting an uncorrectable-error of each row; (B) a location memory, connected to the first decoder, for memorizing locations of rows having uncorrectable-errors detected by the first decoder;

(C) a counter, connected to the first decoder, for counting a number of rows having uncorrectable-errors detected by the first decoder;

(D) a Chien-Search circuit, connected to the first decoder, for calculating error-locations and error-magnitudes of a Euclid algorithm, and for setting a number of the error-locations, wherein the number of uncorrectable-error rows is initially zero; and (E) a second decoder, connected to the first decoder, for correcting errors of each column, for decoding a column based on erasure-and-error correction using the locations in the location memory if the number in the counter is less than a first predetermined value and the number of the error-locations detected in the Chien-Search circuit is initially less than a second predetermined value, and for decoding the column based on error-correction if the number in the counter is more than the first predetermined value, and the number of the error-locations detected in the Chien-Search circuit is initially more than the second predetermined value.

6. The error-correcting decoder according to claim 1 or claim 2 or claim 5, wherein the first decoder corrects only the uncorrectable-errors in each row after the second decoder corrects errors in each column.

7. The error-correcting decoder according to claim 5, further comprising a degree calculator for calculating a degree of a Euclid algorithm, and for detecting an uncorrectable-error if the degree in the degree calculator is different from the number of the error-locations detected in the Chien-Search circuit.

8. The error-correcting decoder according to claim 5, further comprising a flag memory, connected to the first decoder, for setting a burst-error flag on if a number of detected consecutive uncorrectable-errors in each row exceeds a third predetermined value, wherein the second decoder decodes a column based on erasure-and-error correction using the locations in the location memory if the burst-error flag is on, and the number of the error-locations detected in the Chien-Search circuit is initially more than a second predetermined value, and decodes a column based on error-correction if the burst-error flag is set off, and the number of the error-locations detected in the Chien-Search circuit is initially more than the second predetermined value.

9. The error-correcting decoder according to claim 5, further comprising a second counter, connected to the first decoder, for counting a number of maximum error-correction flags, a maximum error-correction flag being set for a row if the number of detected errors of the symbols in each row is equal to a maximum-correctable-error value, wherein the second decoder decodes a column based on erasure-and-error correction using the locations in the location memory if the number in the second counter is less than a third predetermined value, and the number of the error-locations detected in the Chien Search circuit is initially less than the second predetermined value, and decodes a column based on error-correction if the number in the second counter is more than the third predetermined value, and the number of the error-locations detected in the Chien Search circuit is initially more than the second predetermined value.

10. A method for decoding a code signal composed of n2 rows×n1 columns of symbols including error-correction codes, and for correcting errors of the code signal, comprising the steps of:

(A) generating location polynomials based on syndromes of the code signal;

(B) for each row, analyzing error-locations and error-magnitudes of the row based on the location polynomial;

(C) correcting each row using the error-correction codes if an error has occurred and a number of the error-locations is less than a first predetermined value in the row;

(D) for each row, storing an element of the row in a Galois field as a uncorrectable-error element when the number of the error-locations is more than the first predetermined value in the row;

(E) for each row, setting a burst-error flag on when a number of continuously detected uncorrectable-errors of the row exceeds a second predetermined value;

(F) for each column, analyzing error-locations and error-magnitudes of the column based on the location polynomial;

(G) for each column, correcting the column based on erasure-and-error correction when an error has occurred in each column, and a number of the uncorrectable-error elements is less than a third predetermined value, and the burst-error flag is on; and (H) for each column, correcting the column based on error-correction when an error has occurred in the column, and the number of the uncorrectable-error elements is less than a third predetermined value, and the burst-error flag is off.

11. A decoding method for decoding a code signal composed of n1 rows×n2 columns of symbols including error-correction codes, and for correcting errors of the code signal, comprising the steps of;

(A) generating location polynomials based on syndromes of the code signal;

(B) for each row, analyzing error-locations and error-magnitudes of the row based on the location polynomial;

(C) for each row, correcting the row based on error-correction when an error has occurred, and a number of the error-locations is less than a first predetermined value in the row;

(D) for each row, storing an element of the row in a Galois field as a uncorrectable-error element when the number of the error-locations is more than the first predetermined value in the row;

(E) for each row, setting a maximum error-correction flag on if a number of detected errors of each row is equal to a maximum-correctable-error value;

(F) for each column, analyzing error-locations and error-magnitudes of the column based on the location polynomial;

(G) for each column, correcting the column based on erasure-and-error correction when an error has occurred, when a number of uncorrectable-error elements is less than a second predetermined value, and when a number of the maximum error-correction flags is less than a third predetermined value; and (H) for each column, correcting the column based on error correction when an error has occurred, a number of the uncorrectable-error elements is less than the second predetermined value, and the number of the maximum error-correction flags is more than the third predetermined value.

12. The decoding method according to claim 10 or claim 11, further comprising the steps of, for each row, comparing the value of the degree in the location polynomial with the number of the error-locations, and of, for each row, setting an element as a uncorrectable-error element when the degree in the location polynomial is different from the number of the error-locations.

13. The decoding method according to claim 10 or claim 11, further comprising the steps, between steps (F) and (G), of, for each row, comparing the value of the degree in the location polynomial with the number of the error-locations, and of, for each row, leaving an error as it is when the degree in the location polynomial is different from the number of the error locations.

14. A decoding method for decoding a code signal composed of n2 rows×n1 columns of symbols including error-correction codes, and for correcting errors of the code signal, comprising the steps of:

(A) generating location polynomials based on syndromes of the code signal;

(B) for each row, analyzing error-locations and error-magnitudes of the row based on the location polynomial;

(C) for each row, correcting the row based on the error-correction codes when an error has occurred, and when a number of the error-locations is less than a first predetermined value in the row;

(D) for each row, storing an element of the row in a Galois field as an uncorrectable-error element when the number of the error-locations is more than the first predetermined value in the row;

(E) for each column, analyzing error-locations and error-magnitudes of the column based on the location polynomial assuming that every element has a correctable-error;

(F) for each column, analyzing error-locations and error-magnitudes of the column based on the location polynomial when a number of the error locations analyzed in the step (E) is more than a second predetermined value;

(G) for each column, correcting the column based on erasure-and-error-correction when a number of the uncorrectable-error elements is less than a third predetermined value; and (H) for each column, correcting the column based on error-correction when the number of the uncorrectable-error elements is more than the third predetermined value.

15. The method according to claim 10 or claim 11 or claim 14, further comprising the steps, following the last step, of filling in the uncorrectable-error elements of the rows using the correcting step for each column, and of correcting the code data again based on the filling step.

16. The decoding method according to claim 14, further comprising the steps of, for each row, comparing the degree in the location polynomial with the number of the error-locations, and of setting the element as an uncorrectable-error element when the degree in the location polynomial is different from the number of the error locations.

17. The method according to claim 14, further comprising the steps, between step (F) and (G), of, for each row, comparing the value of the degree in the location polynomial with the number of the error-locations, and of, for each column, leaving an error as it is when the degree in the location polynomial in the column is different from the number of the error-locations.

18. A receiver comprising:
(A) a receiving interface for receiving a code signal from a transmission line;
(B) an error-correcting decoder having a first decoder for correcting errors in each row of the code signal, a location memory for storing locations of rows including uncorrectable-errors, a flag memory for setting a burst-error flag on when a number of detected consecutive uncorrectable-errors exceeds a first predetermined value, a counter for counting a number of rows including uncorrectable-error, and a second decoder for correcting errors in each column, for decoding a column based on erasure-and-error correction using the locations in the location memory when the number in the counter is between a second and third predetermined values, and the burst-error flag is set on, and for decoding a column based on error correction when the number in the counter is between the second and third predetermined values and the burst-error flag is off; and
(C) a receiving circuit.

19. A player comprising:
(A) a playback interface for receiving a recorded code signal;
(B) an error-correcting decoder having a first decoder for correcting errors in each row of the code signal, a location memory for storing locations of rows including uncorrectable-errors, a flag memory for setting a burst-error flag on when a number of detected consecutive uncorrectable-errors of a row exceeds a first predetermined value, a counter for counting a number of rows including an uncorrectable-error, and a second decoder for correcting errors in each column, for decoding a column based on erasure-and-error correction using the locations in the location memory when the number in the counter is between a second and third predetermined value, and the burst-error flag is set on, and for decoding a column based on error-correction when the number in the counter is between the second and third predetermined values, and the burst-error flag is off; and
(C) a playback circuit.

20. A method for decoding a block of data which has error correction coding in a first dimension and error correction coding in a second dimension, comprising the steps of:
performing error correction for data sets along the first dimension where error correction is possible from the error correction coding in the first dimension;
determining when a burst error has occurred;
determining a number of total uncorrectable errors in the data sets along the first dimension;
performing error correction for data sets along the second dimension according to erasure-and-error correction when a burst error has occurred and the number is within a predetermined range; and
performing error correction for data sets along the second dimension according to error correction when a burst error has not occurred and the number is within the predetermined range.

21. The method of claim 20, wherein the method of determining when a burst error has occurred includes:
determining a second number representing a largest number of consecutive data sets along the first dimension which have errors; and
determining that a burst error has occurred when the second number exceeds a second value.

22. The method of claim 20, further including the step of:
after completion of error correction for data sets along the second dimension, repeating the step of performing error correction for data sets along the first dimension where previously error correction was not possible from the error correction coding in the first dimension.

23. The method of claim 20, further including the step of:
calculating an error polynomial after performing error correction for data sets along the first dimension, wherein the error polynomial represents locations of errors and number of errors.

24. The method of claim 23, wherein a Euclid algorithm generates the location polynomial, and the polynomial is solved using a Chien Search to obtain error locations and error magnitudes.

25. The method of claim 24, wherein the error locations are stored in memory elements corresponding to locations within a Galois field.

26. A method for decoding a block of data which has error correction coding in a first dimension and error correction coding in a second dimension, comprising the steps of:
performing error correction for data sets along the first dimension where error correction is possible from the error correction coding in the first dimension;
determining a first number representing a number of data sets along the first dimension where a maximum number of correctable errors was present;
determining a second number of total uncorrectable errors in the data sets along the first dimension;
performing error correction for data sets along the second dimension according to erasure-and-error correction when a sum of the first number and the second number is less than a first value and the second number is within a predetermined range; and
performing error correction for data sets along the second dimension according to error correction when a sum of the first number and the second number is greater than or equal to the first value and the second number is within the predetermined range.

27. The method of claim 26, further including the step of:
after completion of error correction for data sets along the second dimension, repeating the step of performing error correction for data sets along the first dimension where previously error correction was not possible from the error correction coding in the first dimension.

28. The method of claim 26, further including the step of:
calculating an error polynomial after performing error correction for data sets along the first dimension, wherein the error polynomial represents locations of errors and number of errors.

29. The method of claim 28, wherein a Euclid algorithm generates the location polynomial, and the polynomial is solved using a Chien Search to obtain error locations and error magnitudes.

30. The method of claim 29, wherein the error locations are stored in memory elements corresponding to locations within a Galois field.

31. An apparatus for decoding a block of data which has error correction coding in a first dimension and error correction coding in a second dimension, comprising:
means for performing error correction for data sets along the first dimension where error correction is possible from the error correction coding in the first dimension;

means for determining when a burst error has occurred;

means for determining a number of total uncorrectable errors in the data sets along the first dimension;

means for performing error correction for data sets along the second dimension according to erasure-and-error correction when a burst error has occurred and the number is within a predetermined range; and means for performing error correction for data sets along the second dimension according to error correction when a burst error has not occurred and the number is within the predetermined range.

32. The apparatus of claim 31, wherein the means for determining when a burst error has occurred includes:

means for determining a second number representing a largest number of consecutive data sets along the first dimension which have errors; and means for determining that a burst error has occurred when the second number exceeds a second value.

33. The apparatus of claim 31, further including:

means for performing error correction for data sets along the first dimension where previously error correction was not possible from the error correction coding in the first dimension after completion of error correction for data sets along the second dimension.

34. The apparatus of claim 31, further including means for calculating an error polynomial after performing error correction for data sets along the first dimension, wherein the error polynomial represents locations of errors and number of errors.

35. The apparatus of claim 34, wherein the means for calculating an error polynomial includes a Euclid algorithm, and the means for solving the error polynomial includes means for using a Chien Search to obtain error locations and error magnitudes.

36. The apparatus of claim 35, wherein the error locations are stored in memory elements corresponding to locations within a Galois field.

37. An apparatus for decoding a block of data which has error correction coding in a first dimension and error correction coding in a second dimension, comprising:

means for performing error correction for data sets along the first dimension where error correction is possible from the error correction coding in the first dimension;

means for determining a first number representing a number of data sets along the first dimension where a maximum number of correctable errors was present;

means for determining a second number of total uncorrectable errors in the data sets along the first dimension;

means for performing error correction for data sets along the second dimension according to erasure-and-error correction when a sum of the first number and the second number is less than a first value and the second number is within a predetermined range; and means for performing error correction for data sets along the second dimension according to error correction when a sum of the first number and the second number is greater than or equal to the first value and the second number is within the predetermined range.

38. The apparatus of claim 37, further including:

means for performing error correction for data sets along the first dimension where previously error correction was not possible from the error correction coding in the first dimension after completion of error correction for data sets along the second dimension.

39. The apparatus of claim 37, further including:

means for calculating an error polynomial after performing error correction for data sets along the first dimension, wherein the error polynomial represents locations of errors and number of errors.

40. The apparatus of claim 39, wherein the means for calculating an error polynomial includes a Euclid algorithm, and the means for solving the error polynomial includes means for using a Chien Search to obtain error locations and error magnitudes.

41. The apparatus of claim 40, wherein the error locations are stored in memory elements corresponding to locations within a Galois field.

* * * * *